(12) United States Patent
Ogino et al.

(10) Patent No.: US 11,276,723 B2
(45) Date of Patent: Mar. 15, 2022

(54) SEMICONDUCTOR DEVICE, APPARATUS, AND METHOD FOR PRODUCING SEMICONDUCTOR DEVICE

(71) Applicant: CANON KABUSHIKI KAISHA, Tokyo (JP)

(72) Inventors: Takumi Ogino, Koganei (JP); Hideaki Ishino, Tokyo (JP); Akihiro Shimizu, Yokohama (JP); Katsunori Hirota, Yamato (JP); Tsutomu Tange, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 211 days.

(21) Appl. No.: 16/597,973

(22) Filed: Oct. 10, 2019

(65) Prior Publication Data

US 2020/0127032 A1 Apr. 23, 2020

(30) Foreign Application Priority Data

Oct. 19, 2018 (JP) .............................. JP2018-197131

(51) Int. Cl.
*H01L 27/146* (2006.01)
*H01L 23/00* (2006.01)
(Continued)

(52) U.S. Cl.
CPC ...... *H01L 27/14632* (2013.01); *H01L 23/562* (2013.01); *H01L 23/564* (2013.01);
(Continued)

(58) Field of Classification Search
CPC .................................................. H01L 27/14632
(Continued)

(56) References Cited

U.S. PATENT DOCUMENTS 8,456,014 B2 6/2013 Kobayashi et al.
9,570,506 B2 2/2017 Endo et al.
(Continued)

FOREIGN PATENT DOCUMENTS

JP 2010-109137 A 5/2010
JP 2012-099742 A 5/2012

OTHER PUBLICATIONS

U.S. Appl. No. 16/600,753, filed Oct. 14, 2019 (First Named Inventor: Toshiyuki Ogawa).

*Primary Examiner* — Joel W Fosselman
(74) *Attorney, Agent, or Firm* — Venable LLP

(57) ABSTRACT

A semiconductor device comprising: a substrate; a semiconductor layer; and a wiring structure section between the substrate and the semiconductor layer, the wiring structure section including a plurality of stacked wiring layers and a plurality of stacked insulating films, the wiring structure section including an electrode, wherein an opening for connecting a member to the electrode is formed in the semiconductor layer and the wiring structure section; the semiconductor layer has an isolation region in which an insulating film is embedded and which surrounds the opening; the wiring structure section has a ring which is formed of the plurality of wiring layers and surround the opening; and a distance between the opening and the ring closest to the opening is larger than a distance between the opening and the isolation region closest to the opening.

18 Claims, 39 Drawing Sheets

(51) Int. Cl.
*H01L 23/60* (2006.01)
*H01L 23/58* (2006.01)

(52) U.S. Cl.
CPC ............ *H01L 23/585* (2013.01); *H01L 23/60* (2013.01); *H01L 27/1469* (2013.01); *H01L 27/14634* (2013.01); *H01L 27/14636* (2013.01); *H01L 27/14687* (2013.01)

(58) Field of Classification Search
USPC ........................................................ 348/294
See application file for complete search history.

(56) References Cited

U.S. PATENT DOCUMENTS

| | | |
|---|---|---|
| 9,769,401 B2 | 9/2017 | Ogino et al. |
| 9,773,833 B2 | 9/2017 | Hirota |
| 2003/0213980 A1* | 11/2003 | Tanaka ................ H01L 23/5222 257/200 |
| 2010/0109006 A1 | 5/2010 | Kobayashi et al. |
| 2011/0186917 A1 | 8/2011 | Akiyama et al. |
| 2014/0346578 A1 | 11/2014 | Hirota |
| 2014/0374863 A1 | 12/2014 | Ogino |
| 2018/0006068 A1 | 1/2018 | Sekikawa |
| 2019/0181219 A1 | 6/2019 | Mori et al. |

* cited by examiner

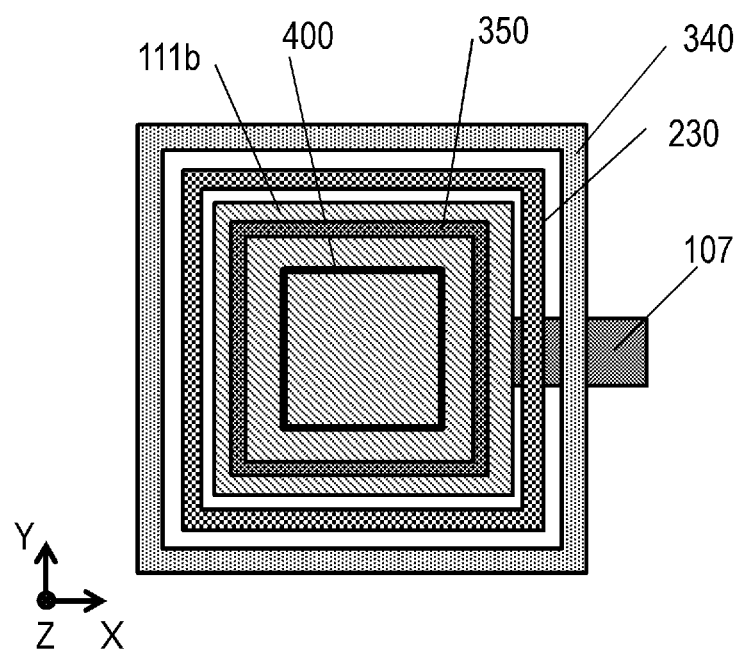

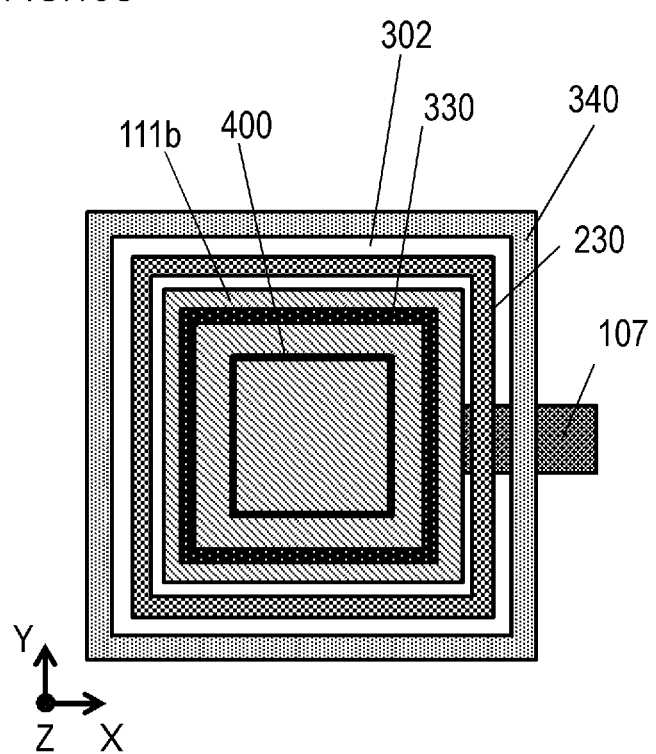

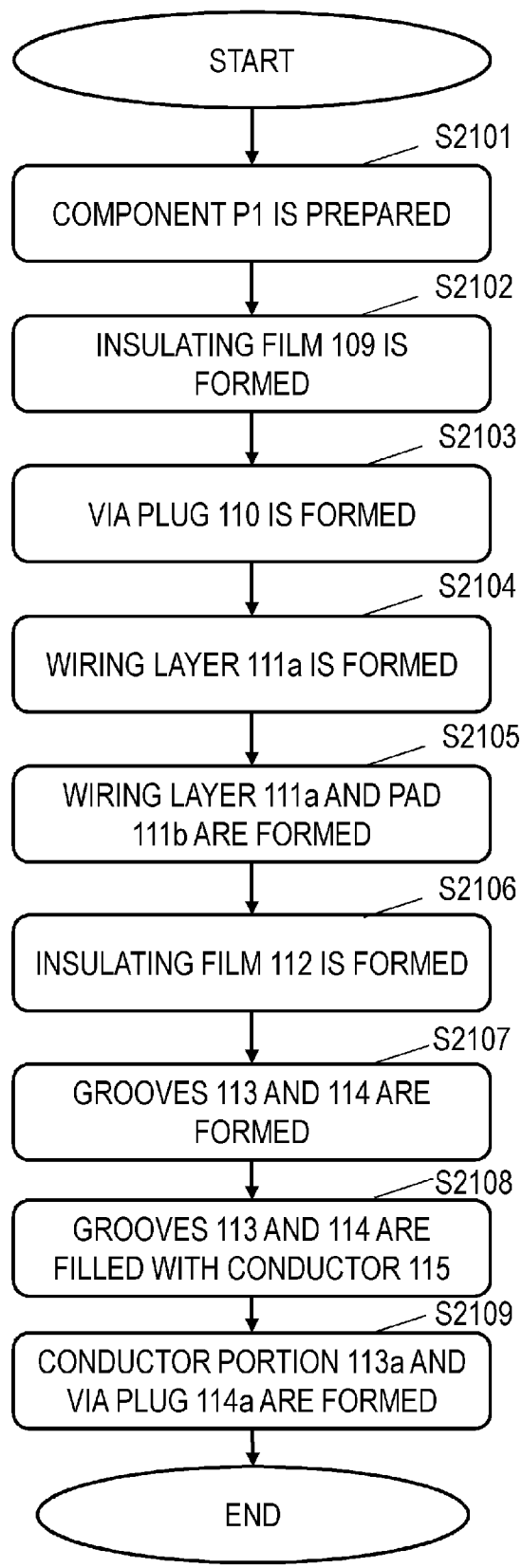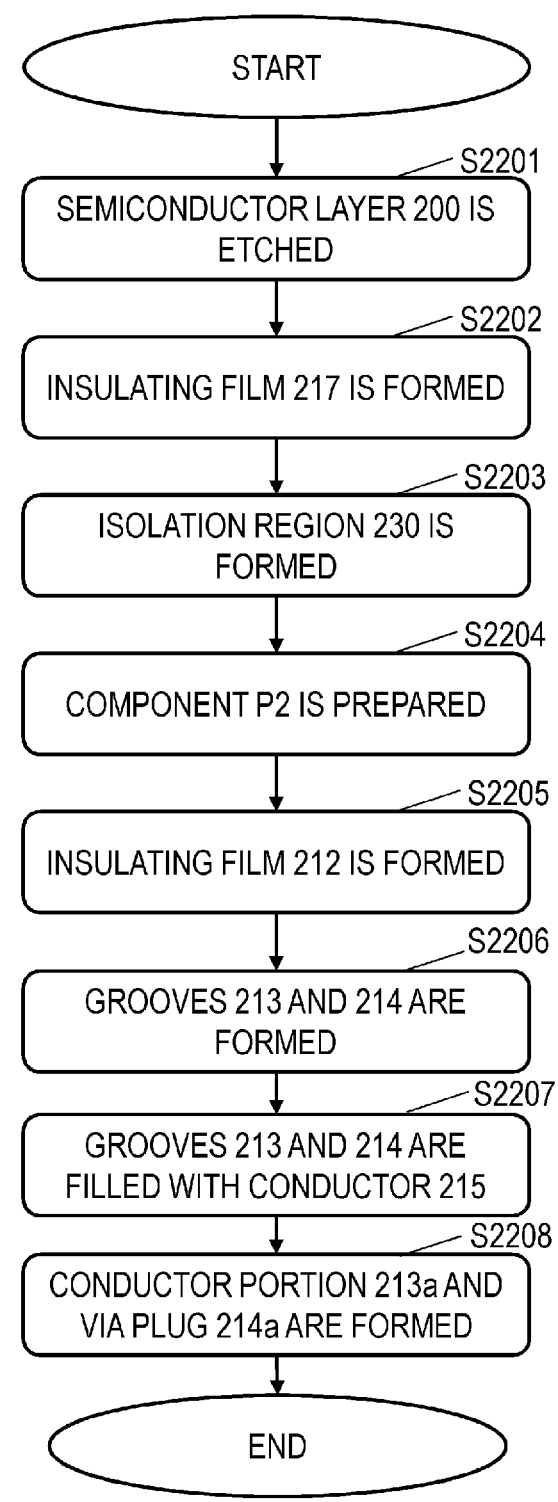

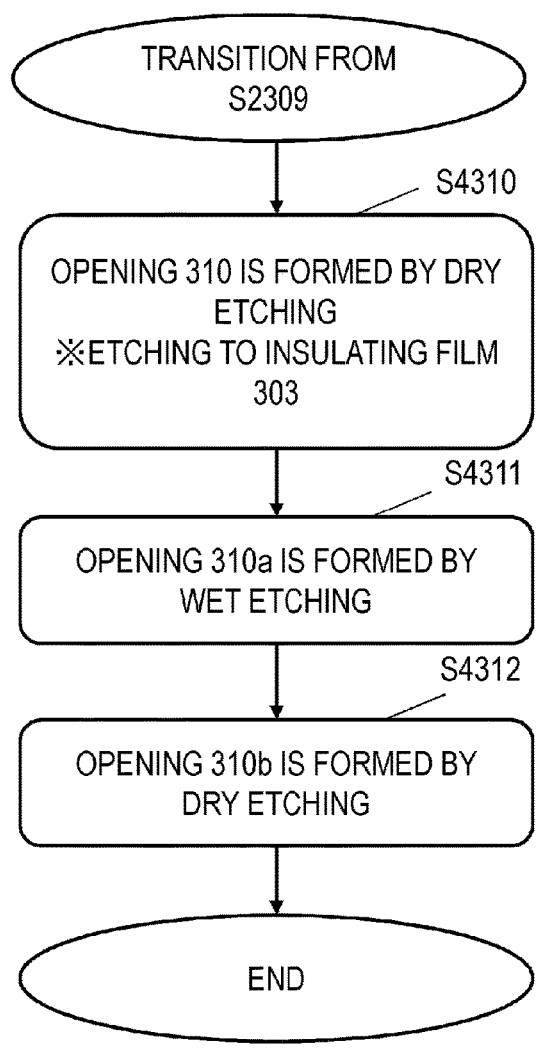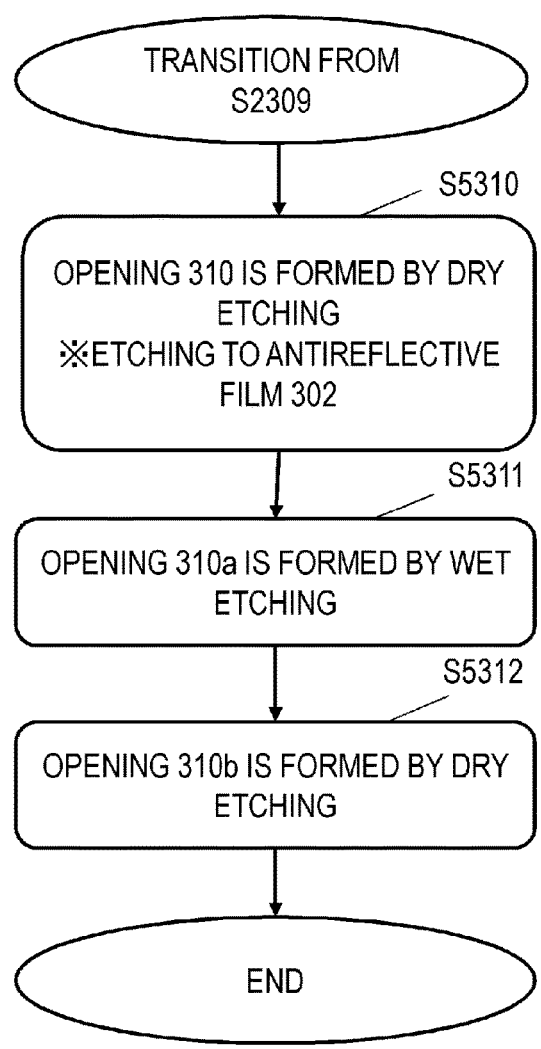

SEMICONDUCTOR DEVICE, APPARATUS, AND METHOD FOR PRODUCING SEMICONDUCTOR DEVICE

BACKGROUND OF THE INVENTION

Field of the Invention

The present technology relates to a semiconductor device, an apparatus, and a method for producing a semiconductor device.

Description of the Related Art

A semiconductor device, such as used as a photoelectric conversion device (fixed image capturing device), is known in which a plurality of semiconductor layers is stacked and a plurality of structures between the plurality of semiconductor layers is bonded.

Japanese Patent Application Publication No. 2010-109137 discloses a semiconductor device comprising a semiconductor element layer, a stacked wiring portion formed of a plurality of wiring layers and a plurality of insulating films, an external connection electrode formed on one of the plurality of wiring layers, and an opening formed in a concave shape from the semiconductor element layer to the stacked wiring portion.

SUMMARY OF THE INVENTION

Here, in Japanese Patent Application Publication No. 2010-109137, in order to prevent peeling of the insulating film, a guard ring is formed in the vicinity of the recess inside the stacked wiring portion. However, the guard ring is disposed in the vicinity of the recess, and the influence of static electricity during production or use may cause breakdown of elements in the semiconductor layer or breakdown of the guard ring, thereby lowering the reliability of the semiconductor device.

A first aspect of the technology of the present disclosure is:

a semiconductor device comprising:
a substrate;
a semiconductor layer; and
a wiring structure section between the substrate and the semiconductor layer, the wiring structure section including a plurality of stacked wiring layers and a plurality of stacked insulating films, the wiring structure section including an electrode, wherein an opening for connecting a member to the electrode is formed in the semiconductor layer and the wiring structure section;

the semiconductor layer has an isolation region in which an insulating film is embedded and which surrounds the opening;

the wiring structure section has a ring which is formed of the plurality of wiring layers and surround the opening; and a distance between the opening and the ring closest to the opening is larger than a distance between the opening and the isolation region closest to the opening.

A second aspect of the technology of the present disclosure is:

a method for producing a semiconductor device, comprising:

a step of preparing a member including a substrate, a semiconductor layer having an isolation region in which an insulating film is embedded, and a wiring structure section including a plurality of stacked wiring layers and a plurality of stacked insulating films, the wiring structure section being provided between the substrate and the semiconductor layer; and a step of forming an opening for exposing a part of an electrode included in the wiring structure section to the outside in the semiconductor layer and the wiring structure section, wherein the wiring structure section has a ring formed by the plurality of wiring layers, and in the step of forming the opening, the opening is formed such that a distance between the opening and the ring closest to the opening is larger than a distance between the opening and the isolation region closest to the opening.

A third aspect of the technology of the present disclosure is:

a method for producing a semiconductor device, comprising:

a step of preparing a member including a substrate, a semiconductor layer, and a wiring structure section including a plurality of stacked wiring layers and a plurality of stacked insulating films, the wiring structure section being provided between the substrate and the semiconductor layer; and a step of forming an opening for exposing a part of an electrode included in the wiring structure section to the outside in the semiconductor layer and the wiring structure section, wherein in the step of forming the opening, the opening is formed by wet etching the semiconductor layer.

Further features of the present invention will become apparent from the following description of exemplary embodiments with reference to the attached drawings.

BRIEF DESCRIPTION OF THE DRAWINGS

FIG. 13C is a transparent plan view of the semiconductor device according to Modification Example 2;

FIGS. 16B and 16C are transparent plan views of the semiconductor device according to Modification Example 4;

FIG. 18A is a flowchart showing a method for producing the first semiconductor component according to Embodiment 2;

FIG. 18B is a flowchart showing a method for producing the second semiconductor component according to Embodiment 2;

FIG. 32A is a flowchart showing a method for producing a semiconductor device according to Modification Example 6;

FIG. 32B is a flowchart showing a method for producing a semiconductor device according to Modification Example 7;

DESCRIPTION OF THE EMBODIMENTS

Figure 1:
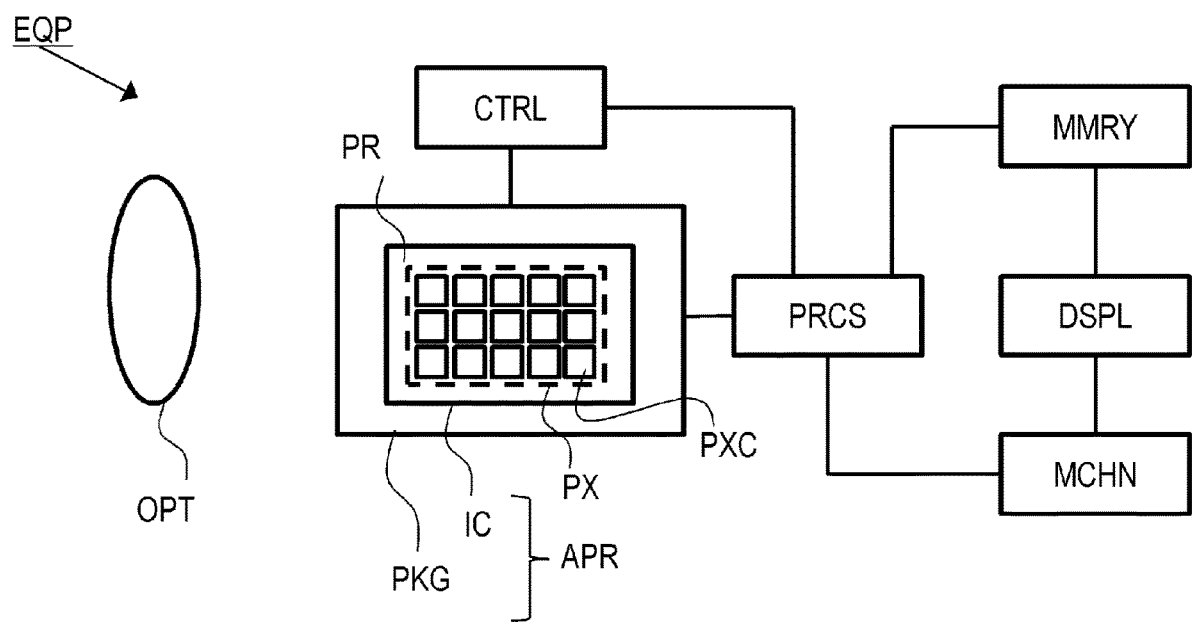
FIG. 1 is a schematic view showing a semiconductor device according to Embodiment 1.

Thus, the technique of the present disclosure aims to improve the reliability of a semiconductor device.

Hereinafter, embodiments of the present invention will be described with reference to the drawings. In the following description and the drawings, the same reference numerals are given to the same configurations throughout the plurality of drawings. Therefore, the common configuration will be described with reference to a plurality of drawings, and the description of the configurations having the same reference numerals will be omitted as appropriate.

Embodiment 1

FIG. 1 is a schematic view illustrating a semiconductor device APR according to the present embodiment. The semiconductor device APR includes, in addition to a semiconductor device IC including a semiconductor layer 100 and a semiconductor layer 200, a package PKG for mounting the semiconductor device IC. In the present embodiment, the semiconductor device APR is a photoelectric conversion device. The semiconductor device IC has a pixel region PX in which pixel circuits PXC are arranged in a matrix and a peripheral region PR around the pixel region PX. Peripheral circuits can be provided in the peripheral region PR.

The semiconductor device APR is also provided in an apparatus EQP. Here, the apparatus EQP may include at least any one of an optical system OPT, a control device CTRL, a processing device PRCS, a display device DSPL, a storage device MMRY, and a mechanical device MCHN. The apparatus EQP will be described in detail hereinbelow.

Figure 2:
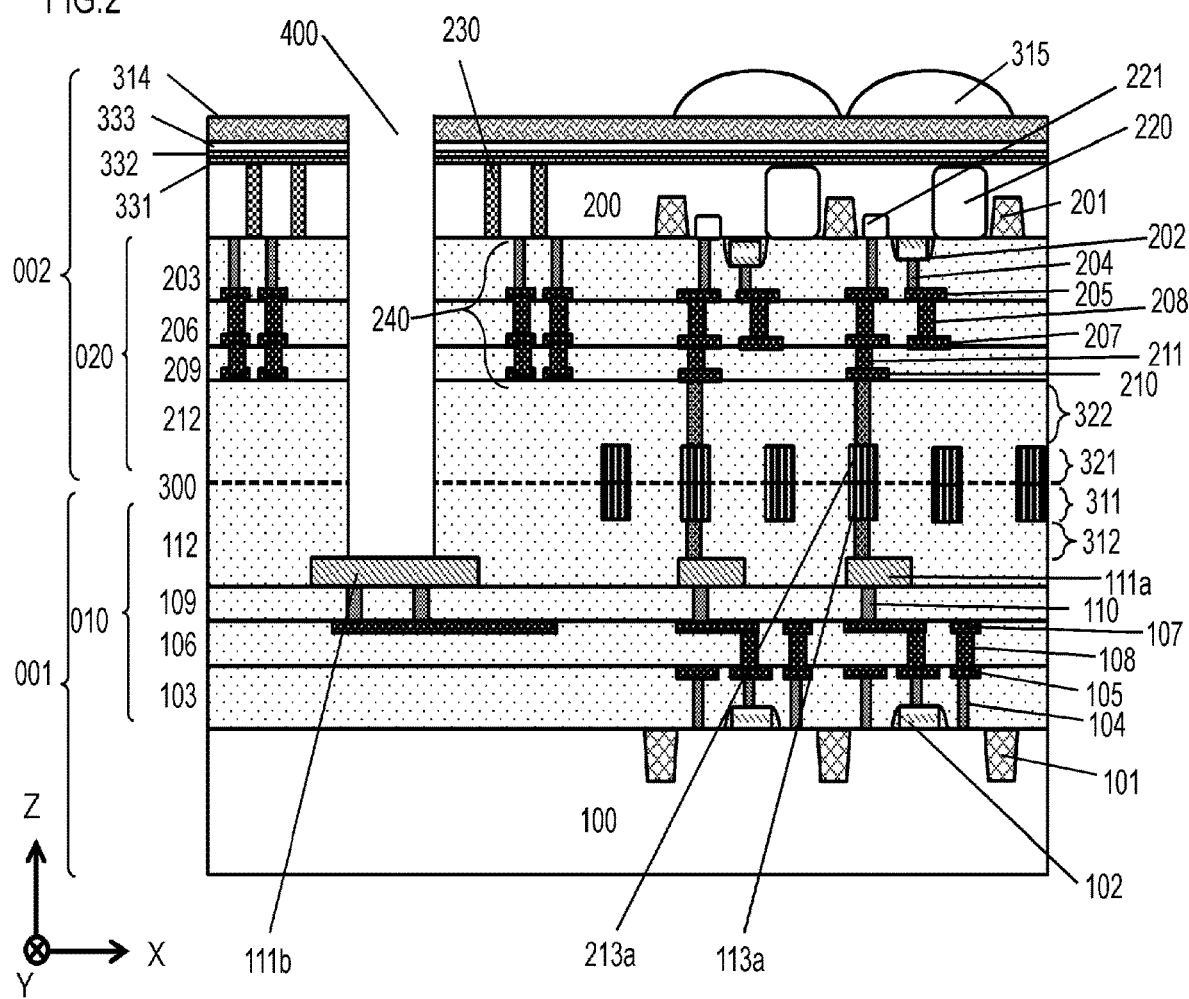
FIG. 2 is a cross-sectional view of the semiconductor device according to Embodiment 1.

FIG. 2 is a cross-sectional view of the semiconductor device APR according to the present embodiment. The semiconductor device APR includes the stacked semiconductor layer 100 and semiconductor layer 200. FIG. 2 is a cross-sectional view showing the semiconductor device APR cut in the stacking direction (Z-axis direction). The semiconductor device APR includes a wiring structure 010 and a wiring structure 020 disposed between the semiconductor layer 100 and the semiconductor layer 200. Here, a component including the semiconductor layer 100 and the wiring structure 010 is a first semiconductor component 001, and a component including the semiconductor layer 200 and the wiring structure 020 is a second semiconductor component 002. Here, the wiring structure 010 and the wiring structure 020 each have a plurality of stacked wiring layers and a plurality of stacked insulating films, as described hereinbelow. Therefore, a structure section in which the wiring structure 010 and the wiring structure 020 are bonded can be referred to as a wiring structure section in the semiconductor device APR. The semiconductor device APR is configured by bonding the first semiconductor component 001 and the second semiconductor component 002.

In the semiconductor device APR, the wiring structure 010 and the wiring structure 020 are bonded. More specifically, the wiring structure 010 and the wiring structure 020 are bonded at a bonding surface 300 constituted by a bonding region 311 of the wiring structure 010 and a bonding region 321 of the wiring structure 020. The bonding surface 300 includes the surface of the bonding region 311 and the surface of the bonding region 321.

The semiconductor device APR also has an opening 400 that exposes a part of an external connection electrode 111b to the outside and serves for connecting a connection member to the external connection electrode 111b. The opening 400 is a space formed from the semiconductor layer 200 of the second semiconductor component 002 toward the external connection electrode 111b and the semiconductor layer 100 of the first semiconductor component 001.

In FIG. 2, the direction in which the semiconductor layer 100 and the semiconductor layer 200 are stacked is shown as a stacking direction Z, and directions orthogonal to the stacking direction Z are shown as orthogonal directions X and Y. Here, the orthogonal direction X and the orthogonal direction Y are orthogonal to each other. Furthermore, in the following description, the side of the semiconductor layer 100 on which the semiconductor layer 200 is disposed in the Z-axis direction is defined as "upper", and the direction opposite to "upper" in the Z-axis direction is defined as "lower".

Wiring Structure 010

The wiring structure 010 includes an insulating film 103, contact plugs 104, a wiring layer 105, an insulating film 106, a wiring layer 107, via plugs 108, an insulating film 109, via plugs 110, a wiring layer 111a, and the external connection electrode 111b. Further, the wiring structure 010 includes an insulating film 112 disposed on the wiring layer 111a and conductor portions 113a.

The via plugs 108 connect the wiring layer 105 and the wiring layer 107.

The via plugs 110 connect the wiring layer 107 and the wiring layer 111a.

The wiring layer 111a is formed simultaneously with the external connection electrode 111b for connection from the outside.

The external connection electrode 111b is, for example, an electrode including aluminum as a main component. In addition, the external connection electrode 111b may include silicon or copper as a minor component less than the main component. The external connection electrode 111b needs to be exposed to the outside in the semiconductor device APR, and therefore, is located below the opening 400 which is a space in the stacking direction.

The conductor portion 113a has a damascene structure embedded in the recess provided in the insulating film 112. At least some of the conductor portions 113a are connected to the wiring layer 111a.

In the present embodiment, the conductor portion 113a has a dual damascene structure such that has a trench and a via. In the conductor portion 113a, a part of the region corresponding to the trench of the dual damascene structure constitutes a bonding region 311 which is bonded to the conductor portion 213a. In the conductor portion 113a, a part of the region corresponding to the via of the dual damascene structure constitutes a connection region 312 connected to the wiring layer 111a.

Wiring Structure 020

The wiring structure 020 includes an insulating film 203, contact plugs 204, a wiring layer 205, an insulating film 206, a wiring layer 207, via plugs 208, an insulating film 209, a wiring layer 210, and via plugs 211. The wiring structure 020 further includes an insulating film 212 and conductor portions 213a. Furthermore, the wiring structure 020 has guard rings 240.

The via plugs 208 connect the wiring layer 205 and the wiring layer 207, and the via plugs 211 connect the wiring layer 207 and the wiring layer 210.

The guard rings 240 are formed in the process of forming the contact plugs 204, the wiring layer 205, the via plugs 208, the wiring layer 207, the via plugs 211, and the wiring layer 210, and surround the outer periphery of the opening 400. Therefore, the guard rings 240 are formed of a plurality of wiring layers. Here, the guard rings 240 are electrically connected to a portion of the semiconductor layer 200 on the opposite side of an isolation region 230 from the opening 400.

The conductor portion 213a has a damascene structure embedded in a recess provided in the insulating film 212. At least some of the conductor portions 213a are connected to the wiring layer 210. In the present embodiment, the conductor portion 213a has a dual damascene structure. In the conductor portion 213a, a part of the region corresponding to the trench of the dual damascene structure constitutes a bonding region 321 which is bonded to the conductor portion 113a. In the conductor portion 213a, a part of the region corresponding to the via of the dual damascene structure constitutes a connection region 322 connected to the wiring layer 210.

The main component of the conductor portions 113a and 213a is preferably copper, but is not limited thereto. The main component of the conductor portions 113a and 213a may be gold or silver. The main component of the insulating films 112 and 212 is preferably a silicon compound. Further, the insulating films 112 and 212 may have a multilayer structure made of a plurality of materials, such as a film structure in which a metal diffusion preventing film (for example, a SIN film) and an oxide film are stacked. With such a configuration, it is possible to prevent the influence of the diffusion of the metal due to the bonding deviation of the conductor portions 113a and 213a due to the alignment deviation generated at the time of bonding the first semiconductor component 001 and the second semiconductor component 002. The main component of the insulating films 112 and 212 may be a resin.

Configuration of Semiconductor Layer 100

Element isolations 101 and gate electrodes 102 of a plurality of transistors are provided in the semiconductor layer 100. In the semiconductor device APR as a photoelectric conversion device, the integrated circuit of the semiconductor layer 100 can include a signal processing circuit such as an AD conversion circuit or a noise removal circuit which processes a pixel signal. Further, the semiconductor layer 100 can be referred to as a "substrate" or a "semiconductor substrate".

The element isolation 101 has a shallow trench isolation (STI) structure, and defines an element region (active region) of the semiconductor layer 100.

The plurality of gate electrodes 102 can constitute a CMOS circuit. The source/drain of the gate electrode 102 can have a silicide layer such as cobalt silicide or nickel silicide. The transistor gate electrode of the gate electrode 102 can have a silicide layer, a metal layer, or a metal compound layer. The gate insulating film of the gate electrode 102 may be a silicon nitride film or a metal oxide film.

Semiconductor Layer 200

Element isolations 201, transfer gates 202, photodiodes 220, floating diffusions 221, and the isolation region 230 are provided in the semiconductor layer 200.

The element isolation 201 has an STI structure and defines an element region (active region) of the semiconductor layer 200.

The transfer gate 202 transfers the charge of the photodiode 220 to the floating diffusion 221.

Further, the semiconductor layer 200 is provided with a pixel circuit PXC that converts the charge generated by the photodiode 220 into a pixel signal. The pixel circuit PXC can include a pixel transistor such as a reset transistor, an amplification transistor, and a selection transistor.

In the semiconductor device APR used as a photoelectric conversion device, a metal oxide film 331, an antireflective film 332, an insulating film 333, a color filter 314, and a microlens 315 are disposed on the semiconductor layer 200. The insulating film 333 may include, for example, a light-shielding film for forming an OB region to be formed of a metal film such as tungsten, or a light-shielding wall for separation so that the light of each pixel is not mixed.

In the isolation region 230, an insulating film is embedded, and penetrates the semiconductor layer 200 in the vertical direction (Z-axis direction). With the isolation region 230, it is possible to suppress the propagation of static electricity, plasma, and the like that damage the semiconductor device APR to the inside of the semiconductor layer 200 (semiconductor device APR).

Arrangement Relationship Between Opening, Isolation Region, and Guard Ring

Figure 3:
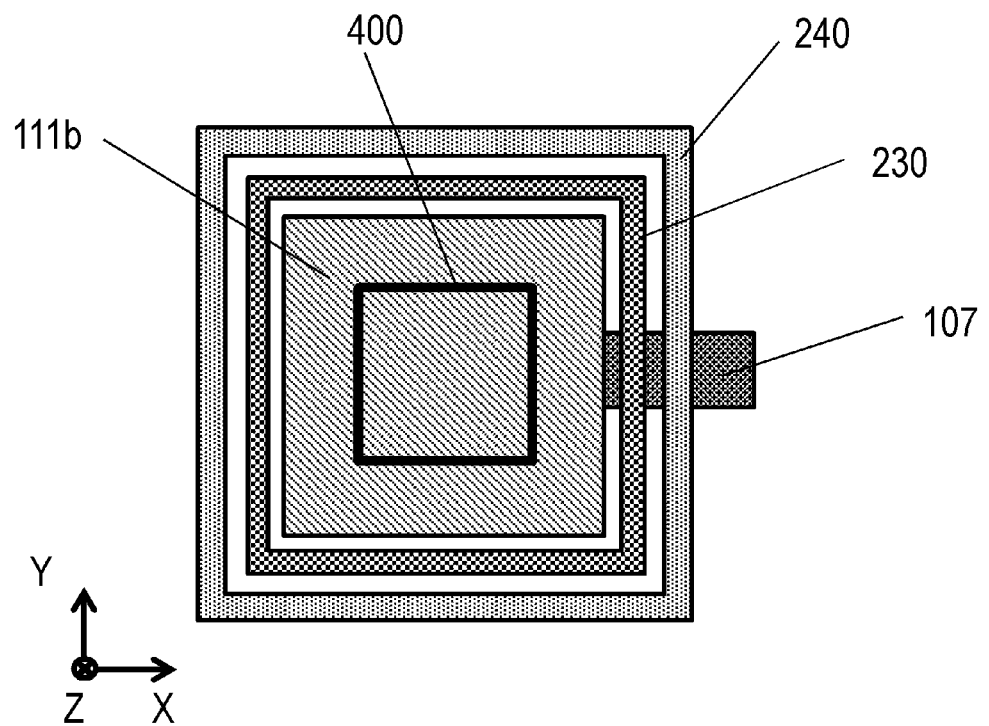
FIG. 3 is a transparent plan view of the semiconductor device according to Embodiment 1.

FIG. 3 is a plan view seen from above (Z-axis direction) of the arrangement relationship between the opening 400, the isolation region 230, the guard ring 240, and the external connection electrode 111b of the semiconductor device APR according to the present embodiment shown in FIG. 2. Here, the isolation region 230 is provided to surround the outer periphery of the opening 400. The guard ring 240 is formed on the outer periphery of the isolation region 230, and the guard ring 240 is connected to the semiconductor layer 200. Moreover, the guard ring 240 shown in FIG. 3 is a guard ring which surrounds the opening 400 on the innermost side among a plurality of guard rings 240. Therefore, in FIG. 3, the isolation region 230 is disposed between the opening 400 and the guard ring 240. More specifically, one or more isolation regions 230 are present at a distance from the opening 400 which is less than the distance between the opening 400 and the guard ring 240 closest to the opening 400. In other words, the distance between the opening 400 and the guard ring 240 closest to the opening 400 is larger than the distance between the opening 400 and the isolation region 230 closest to the opening 400. Further, in the present embodiment, the distance between two configurations indicates the spacing between the two configurations, and more specifically, the shortest distance from the end of one configuration which is the closest to the other configuration to the end of the other configuration which is the closest to the one configuration.

In FIG. 3, the external connection electrode 111b is configured to extend to the inside of the isolation region 230 as viewed from above, but may be configured to extend to the outside from the isolation region 230 or may be configured to extend to the outside of the guard ring 240.

With such a positional relationship between the guard ring 240 and the isolation region 230, the isolation region 230 can suppress the operation of the guard ring 240 as an antenna, so that the possibility of acquiring static electricity or plasma that can damage the semiconductor device APR can be suppressed. Furthermore, the possibility of causing breakdown of the semiconductor device APR or breakdown of the guard ring 240 by charge-up by plasma at the time of forming the opening 400 by performing dry etching on the semiconductor layer 200 can be reduced. Therefore, the reliability of the semiconductor device APR is improved.

Figure 4A:
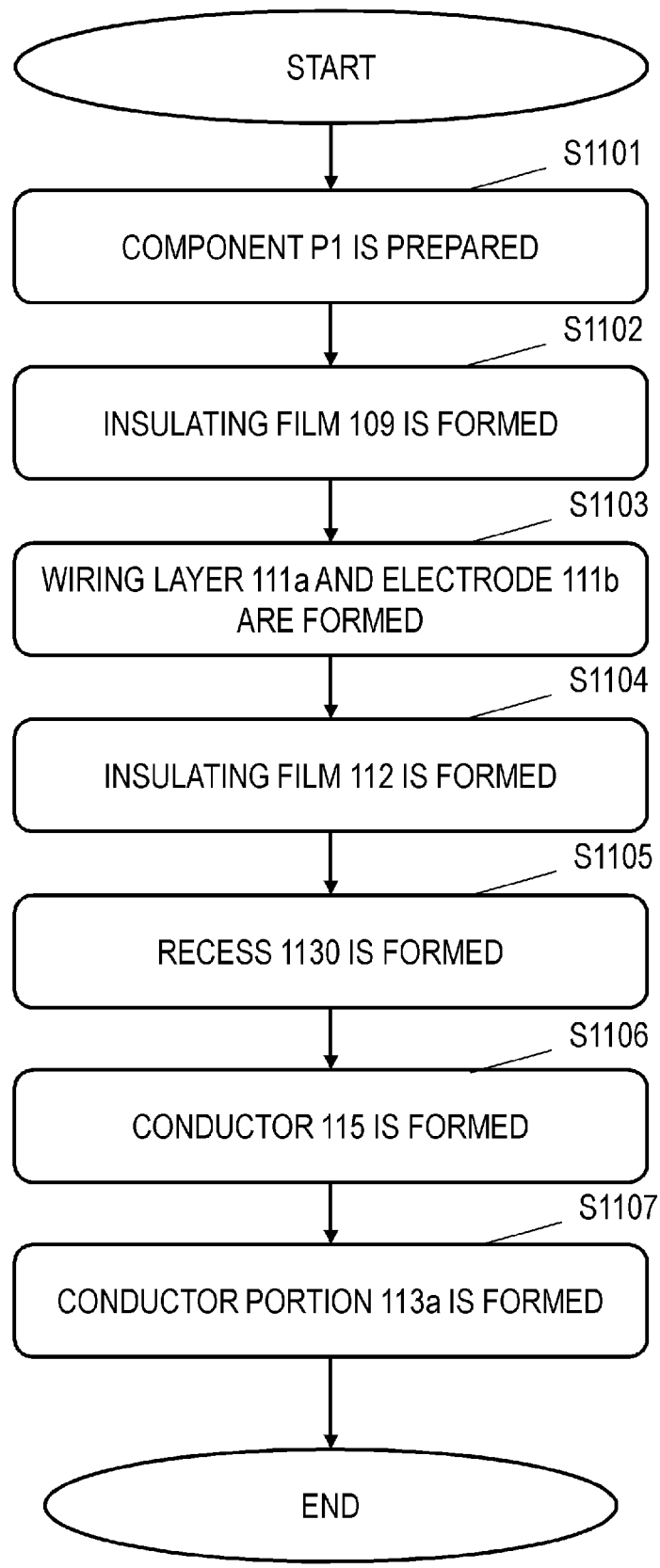
FIGS. 4A to 4C are flowcharts showing a method for producing the semiconductor device according to Embodiment 1.
Figure 4B:
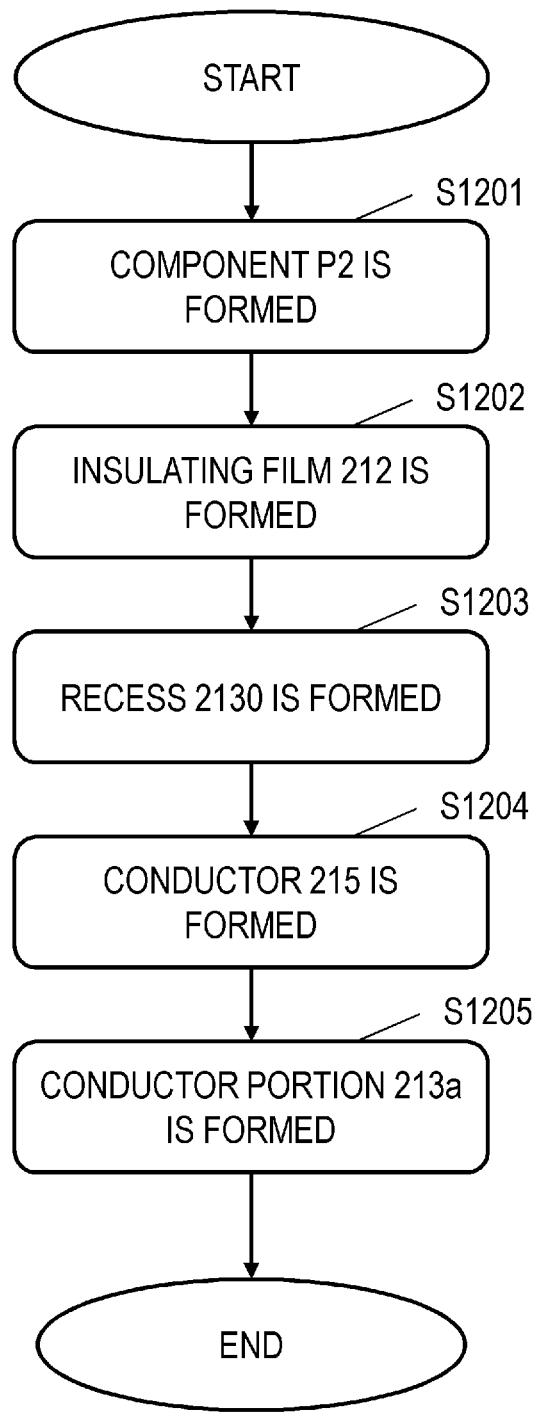
Figure 4C:
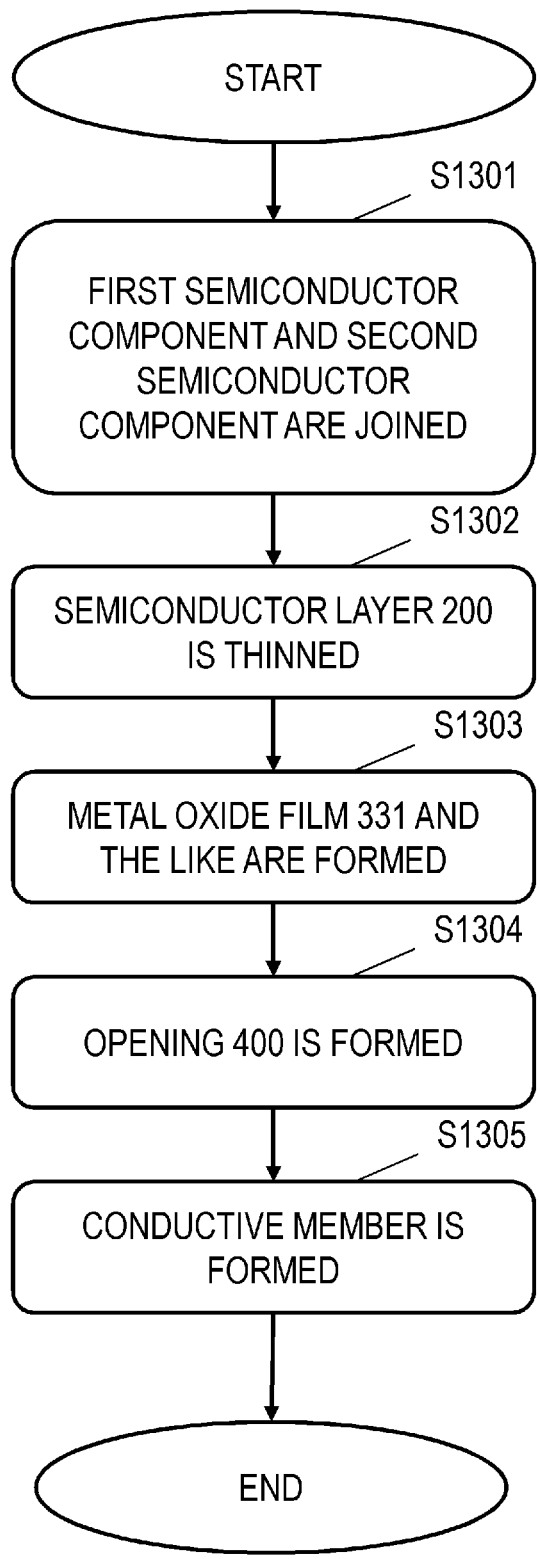

Methods for Producing First Semiconductor Component 001, Second Semiconductor Component 002, and Semiconductor Device APR Methods for producing the first semiconductor component 001, the second semiconductor component 002, and the semiconductor device APR will be described using the flowcharts shown in FIGS. 4A to 4C. Hereinafter, a method for producing the first semiconductor component 001 and a method for producing the second semiconductor component 002 will be described in order, and then a method for producing the semiconductor device APR using the first semiconductor component 001 and the second semiconductor component 002 will be described. In the following production methods, the semiconductor device APR or the like may be produced by a person, or the production method may be performed by a production apparatus or the like.

Method for Producing First Semiconductor Component 001

First, the method for producing the first semiconductor component 001 will be described with reference to the flowchart shown in FIG. 4A and FIGS. 5A to 6B which are external views (cross-sectional views) of the production steps of the first semiconductor component 001.

Figure 5A:
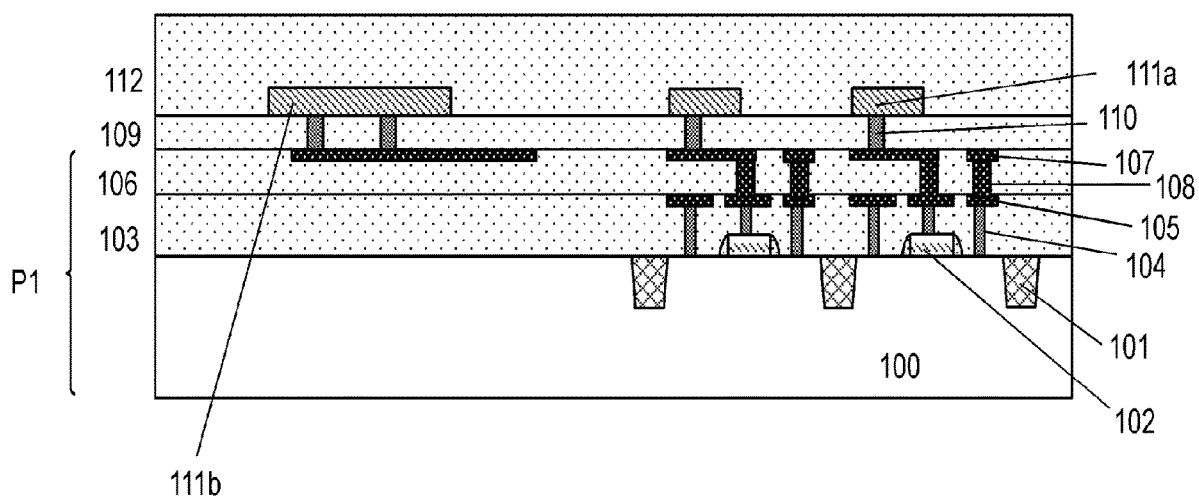
FIGS. 5A and 5B are cross-sectional views showing the production steps of the first semiconductor component according to Embodiment 1.

In S1101, first, a component P1 which is a part of the first semiconductor component 001 shown in FIG. 5A is prepared. The component P1 includes the semiconductor layer 100, the element isolations 101, the gate electrodes 102, the insulating film 103, and the contact plugs 104. Further, the component P1 includes the wiring layer 105, the insulating film 106, the wiring layer 107, and the via plugs 108 connecting the wiring layer 105 and the wiring layer 107. These configurations are common to semiconductor devices, and the description of the preceding production steps is omitted.

In S1102, the insulating film 109 is formed on the insulating film 106. The insulating film 109 is, for example, a silicon oxide film, a silicon nitride film, a silicon oxynitride film, a carbon-containing silicon oxide film, a fluorine-containing silicon oxide film, or the like. The layer configuration of the insulating film 109 may be a single-layer configuration made of one type of material, or a multilayer configuration made of a plurality of materials. Next, grooves are formed by etching from the surface of the insulating film 109, a conductor is formed over the entire surface by PVD or CVD, and the grooves are filled with the conductor. By removing the conductor on the surface by chemical mechanical polishing, etch back or the like, as shown in FIG. 5A, the via plugs 110 are formed inside the insulating film 109.

In S1103, a conductor (conductor film) is formed on the insulating film 109. The material of the conductor is preferably aluminum or the like. The conductor is then patterned. The patterning is performed by photolithography and etching, and a part of the conductor is formed as the wiring layer 111a. Similarly, a part of the conductor is formed as the external connection electrode 111b by patterning. In the present embodiment, the wiring layers are three layers, namely, the wiring layer 105, the wiring layer 107, and the wiring layer 111a, but the number of wiring layers can be selected arbitrarily. Further, in the present embodiment, the MOS transistor is disposed on the surface of the semiconductor layer 100, but the present invention is not limited to such a configuration. For example, a MOS capacitor, a trench capacitor, a resistor using a part of the semiconductor layer 100, a resistor using a gate electrode 102, or the like can be arranged on the surface. Further, it is also possible to arrange an MIM capacitor or the like between the wiring layers.

In S1104, as shown in FIG. 5A, the insulating film 112 is formed on the insulating film 109. The insulating film 112 is, for example, a silicon oxide film, a silicon nitride film, a silicon oxynitride film, a carbon-containing silicon oxide film, a fluorine-containing silicon oxide film, or the like. Here, for example, by performing planarization by chemical mechanical polishing after forming a silicon oxide film, it is possible to reduce problems caused by the difference in level in the subsequent steps. Further, the layer configuration of the insulating film 112 may be a single-layer configuration made of one type of material. Furthermore, a multilayer configuration made of a plurality of materials may be used, such as a film structure in which a layer for preventing metal diffusion (for example, a silicon nitride layer or a silicon carbide layer) and a silicon oxide layer are stacked. In such a case, it is possible to prevent the influence of metal diffusion due to the bonding deviation of the conductor portions 113a and 213a caused by alignment deviation generated at the time of bonding the first semiconductor component 001 and the second semiconductor component 002.

Figure 5B:
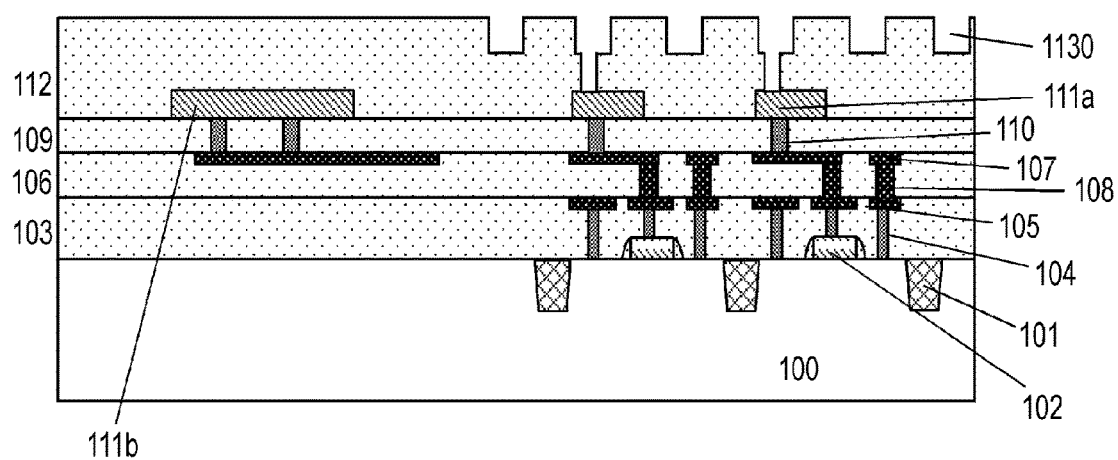

In S1105, as shown in FIG. 5B, a plurality of recesses 1130 for embedding the conductor portions is formed in the insulating film 112. At least some of the plurality of recesses 1130 are formed to have a via hole reaching the wiring layer 111a. The recesses 1130 are arranged to have an appropriate density in the semiconductor device APR. Here, the recess 1130 includes a trench and a via hole disposed at the bottom of the trench.

Figure 6A:
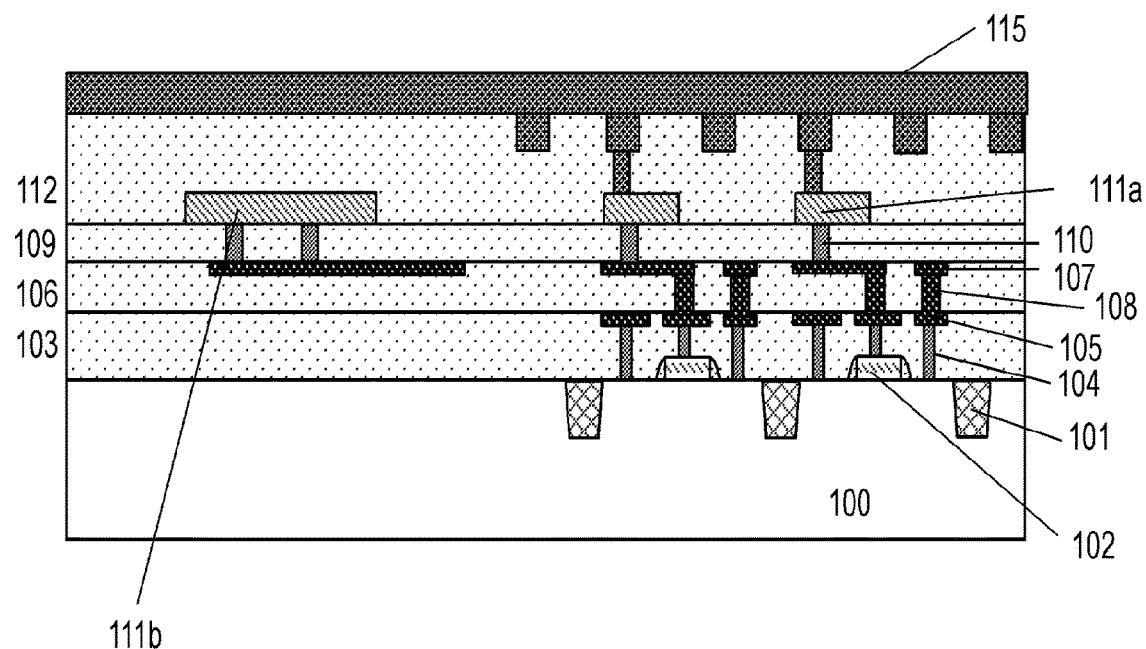
FIGS. 6A and 6B are cross-sectional views showing the production steps of the first semiconductor component according to Embodiment 1.

In S1106, as shown in FIG. 6A, the conductor 115 is formed on the entire surface of the insulating film 112. At this time, the recesses 1130 are filled with the conductor 115. Copper is suitable as a material of the conductor 115.

Figure 6B:
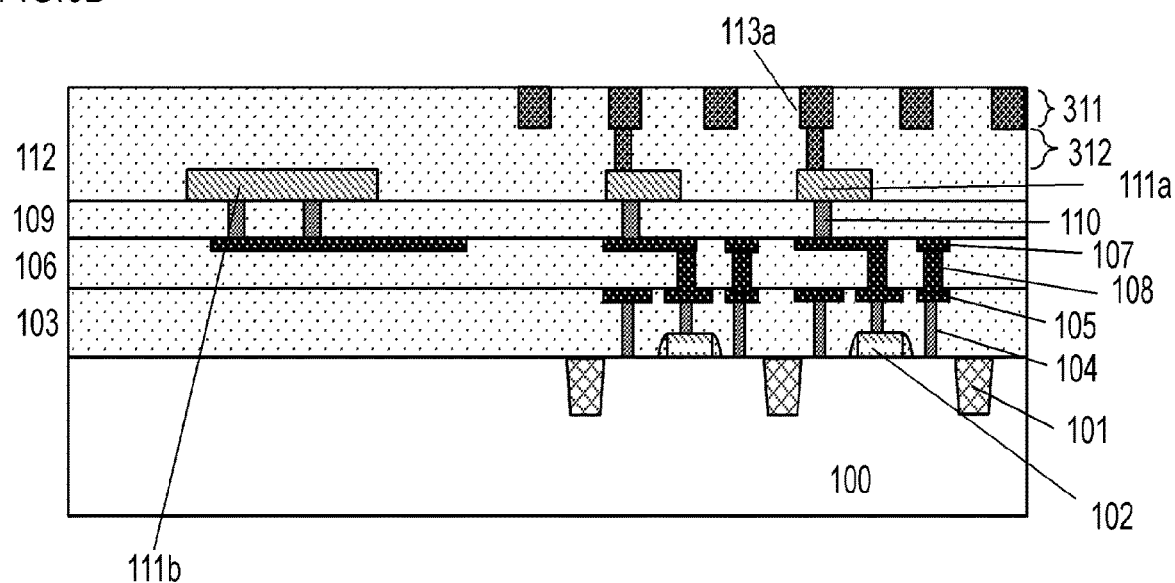

In S1107, as shown in FIG. 6B, the conductor 115 present above the insulating film 112 is removed by the chemical mechanical polishing method to form the conductor portions 113a each including the bonding region 311 and the connection region 312. Here, the bonding region 311 is formed in the trench in the recess 1130, and the connection region 312 is formed in the via hole in the recess 1130. Thus, the first semiconductor component 001 before bonding is formed.

Since conductor portions 113a are formed so as to have an appropriate density in the semiconductor device APR during chemical mechanical polishing, dishing and erosion caused by chemical mechanical polishing are suppressed. Thus, the flatness of the surface of the first semiconductor component 001 before bonding is improved. Therefore, it is possible to reduce the problems caused by the difference in level at the time of bonding the first semiconductor component 001 and the second semiconductor component 002.

Method for Producing Second Semiconductor Component 002

Subsequently, a method for producing the second semiconductor component 002 will be described with reference to the flowchart shown in FIG. 4B and FIGS. 7A to 8B which are external views (cross-sectional views) of the production steps of the second semiconductor component 002.

Figure 7A:
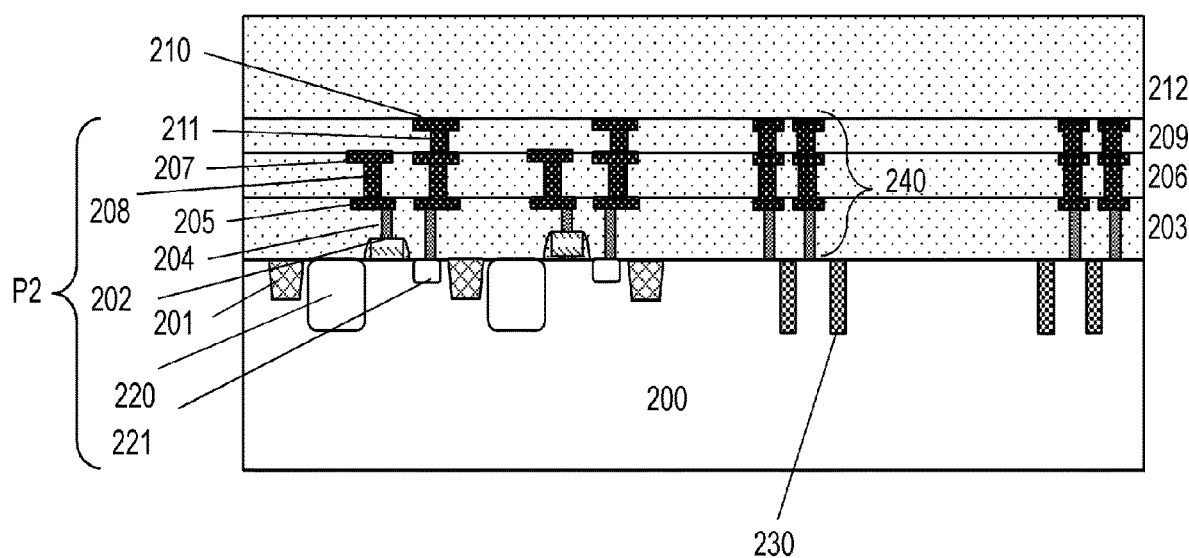
FIGS. 7A and 7B are cross-sectional views showing the production steps of the second semiconductor component according to Embodiment 1.

In S1201, a component P2 which is a part of the second semiconductor component 002 shown in FIG. 7A is prepared. The component P2 includes the semiconductor layer 200, the element isolations 201, the transfer gates 202, the insulating film 203, and the contact plugs 204. The component P2 further includes the wiring layer 205, the insulating film 206, the wiring layer 207, and the via plugs 208. The component P2 further includes the insulating film 209, the wiring layer 210, and the via plugs 211. Here, the via plugs 208 connect the wiring layer 205 and the wiring layer 207, and the via plugs 211 connect the wiring layer 207 and the wiring layer 210. The component P2 further includes guard rings 240 formed in the process of forming the contact plugs 204, the wiring layer 205, the via plugs 208, the wiring layer 207, the via plugs 211, and the wiring layer 210. These configurations are common to semiconductor devices, and the description of the preceding production steps process is omitted.

Here, in the semiconductor layer 200, the photodiodes 220 and the floating diffusions 221 are provided. In the semiconductor layer 200, the isolation regions 230 are formed. The isolation regions 230 preferably have a depth such as to be exposed during thinning at the time of bonding the first semiconductor component 001 and the second semiconductor component 002 in S1302, and are formed by embedding an insulating film such as a SIN film. Although the number of wiring layers is three in the present embodiment, the number of wiring layers can be selected arbitrarily.

In the present embodiment, it is assumed that a MOS transistor is disposed on the surface of the semiconductor layer 200, but the present invention is not limited to such a configuration. For example, a MOS capacitor, a trench capacitor, a resistor using a part of the semiconductor layer 200, a resistor using a gate electrode, or the like can be arranged. Further, it is also possible to arrange an MIM capacitor or the like between the wiring layers.

In S1202, the insulating film 212 is formed on the insulating film 209. The insulating film 212 is a member similar to the insulating film 112.

Figure 7B:
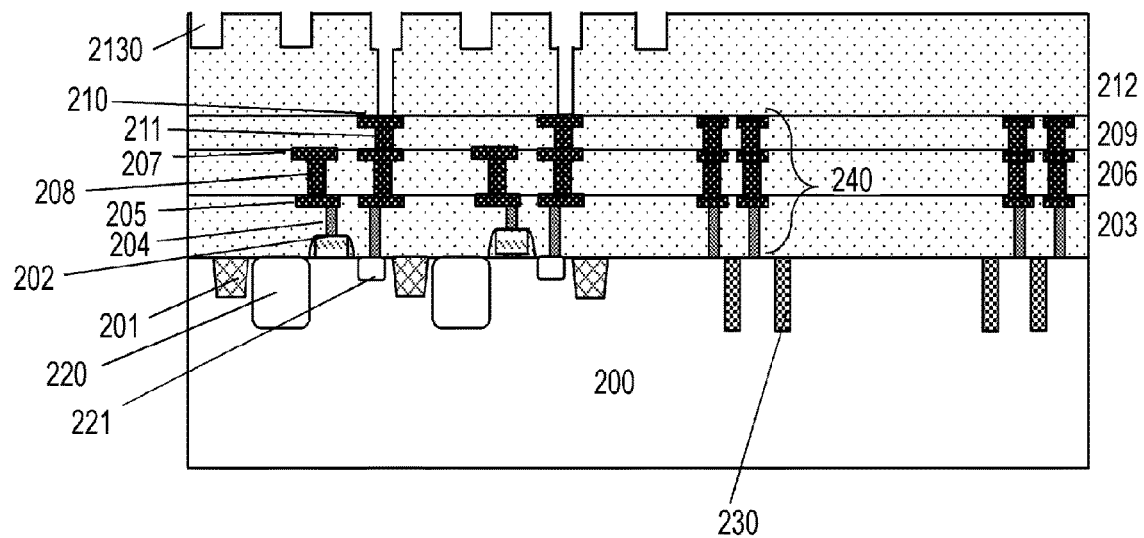

In S1203, similarly to S1105, as shown in FIG. 7B, a plurality of recesses 2130 for embedding the conductor portions are formed in the insulating film 212. The recess 2130 includes a trench and a via hole disposed at the bottom of the trench. At least some of the plurality of recesses 2130 are formed to have a via hole reaching the wiring layer 210. The recesses 2130 are arranged so as to have an appropriate density in the semiconductor device APR.

Figure 8A:
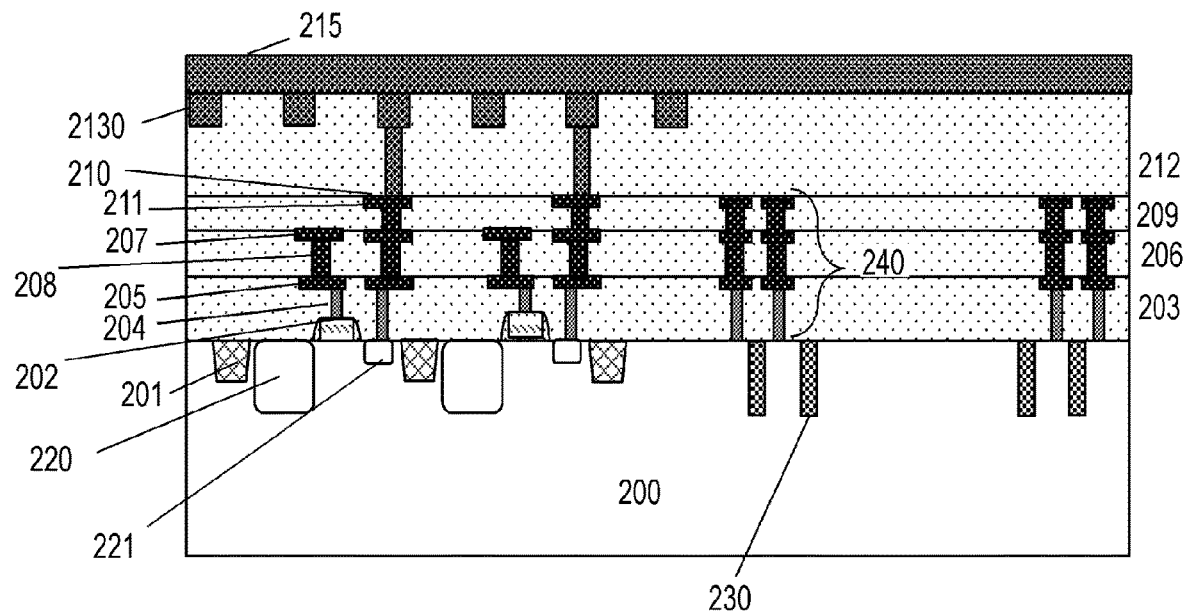
FIGS. 8A and 8B are cross-sectional views showing the production steps of the second semiconductor component according to Embodiment 1.

In S1204, similarly to S1106, as shown in FIG. 8A, the conductor 215 is formed over the entire surface of the insulating film 212. At this time, the recesses 2130 are filled with the conductor 215. Copper is suitable as a material of the conductor 215.

Figure 8B:
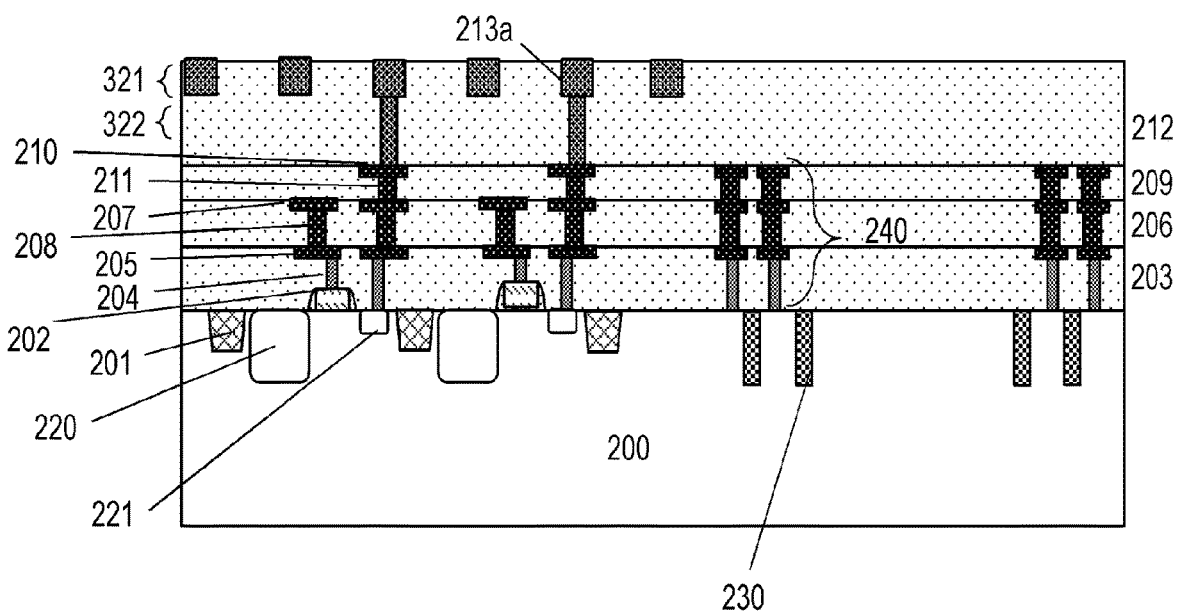

In S1205, similarly to S1107, as shown in FIG. 8B, the conductor 215 present above the insulating film 212 is removed by chemical mechanical polishing to form the conductor portions 213a connected to the wiring layer 210. Here, the bonding region 321 is formed in the trench in the recess 2130, and the connection region 322 is formed in the via hole in the recess 2130. Thus, the second semiconductor component 002 before bonding is formed.

In the chemical mechanical polishing, the recesses 2130 are arranged to have an appropriate density in the semiconductor device APR, so that dishing and erosion caused by chemical mechanical polishing are suppressed. Therefore, the flatness of the surface of the second semiconductor component 002 before bonding is improved.

Method for Producing Semiconductor Device APR

Subsequently, a method for producing the semiconductor device APR will be described using the flowchart shown in FIG. 4C and FIGS. 9 to 11 which are external views (cross-sectional views) of the production steps of the semiconductor device APR.

Figure 9:
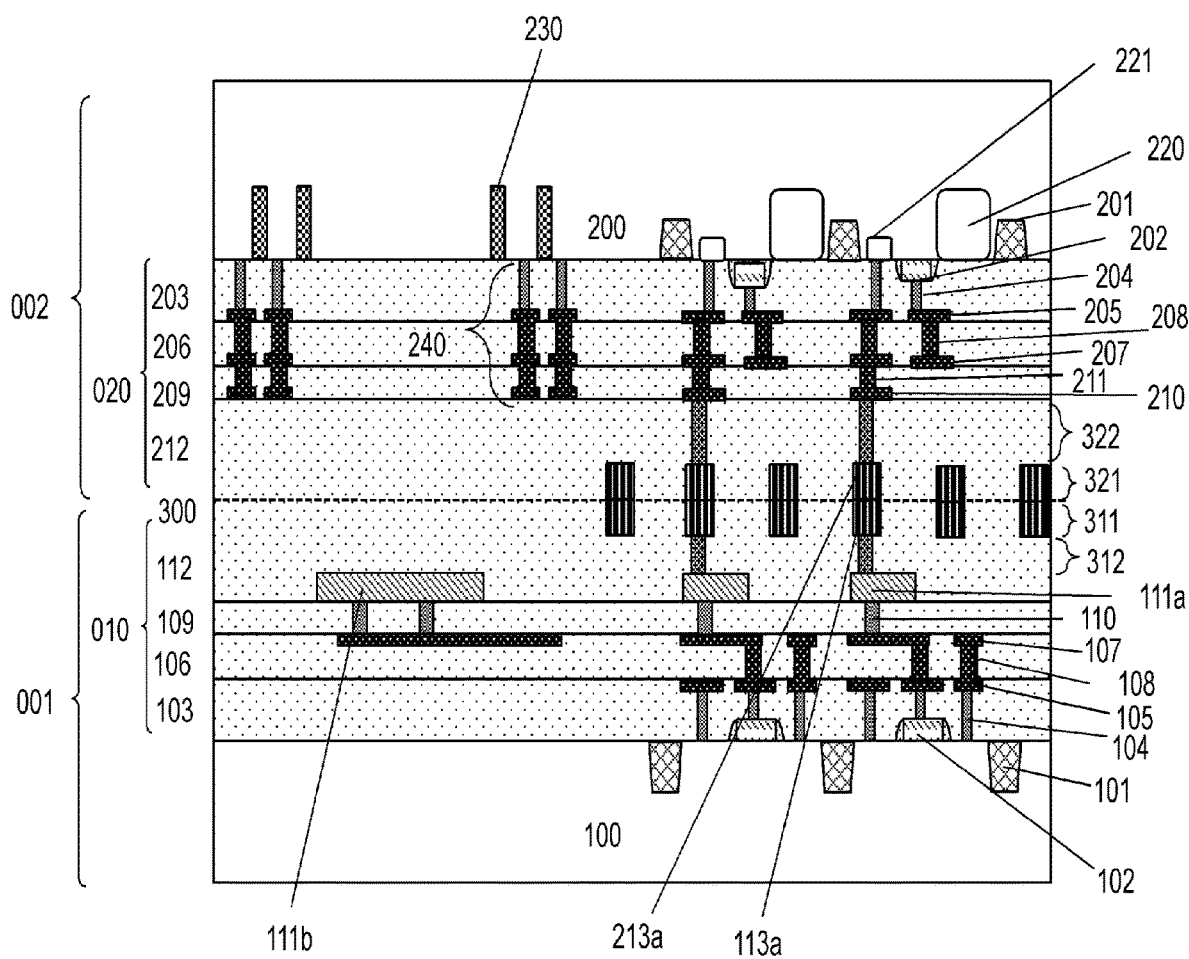
FIG. 9 is a cross-sectional view showing the production steps of the semiconductor device according to Embodiment 1.

In S1301, as shown in FIG. 9, the second semiconductor component 002 shown in FIG. 8B is turned upside down, and the first semiconductor component 001 and the second semiconductor component 002 are bonded at the bonding surface 300. By the bonding, a member having a structure in which the second semiconductor component 002 is stacked on the first semiconductor component 001 is formed. At this time, since the surfaces of the first semiconductor component 001 and the second semiconductor component 002 are flat, the occurrence of bonding defects is reduced. For example, the bonding is performed by performing pre-bonding by a plasma activation bonding method, and then performing heat treatment at approximately 350° C. to bond the insulating film 112 and the insulating film 212 on the bonding surface 300, and to bond the conductor portions 113a and the conductor portions 213a. In such a manner, it is possible to prepare a member including the semiconductor layer 100, the semiconductor layer 200, and a wiring structure section configured of a plurality of stacked wiring layers and a plurality of stacked insulating films, the wiring structure section being arranged between the semiconductor layer 100 and the semiconductor layer 200. As described above, the wiring structure section is configured of the wiring structure 010 and the wiring structure 020.

Figure 10:
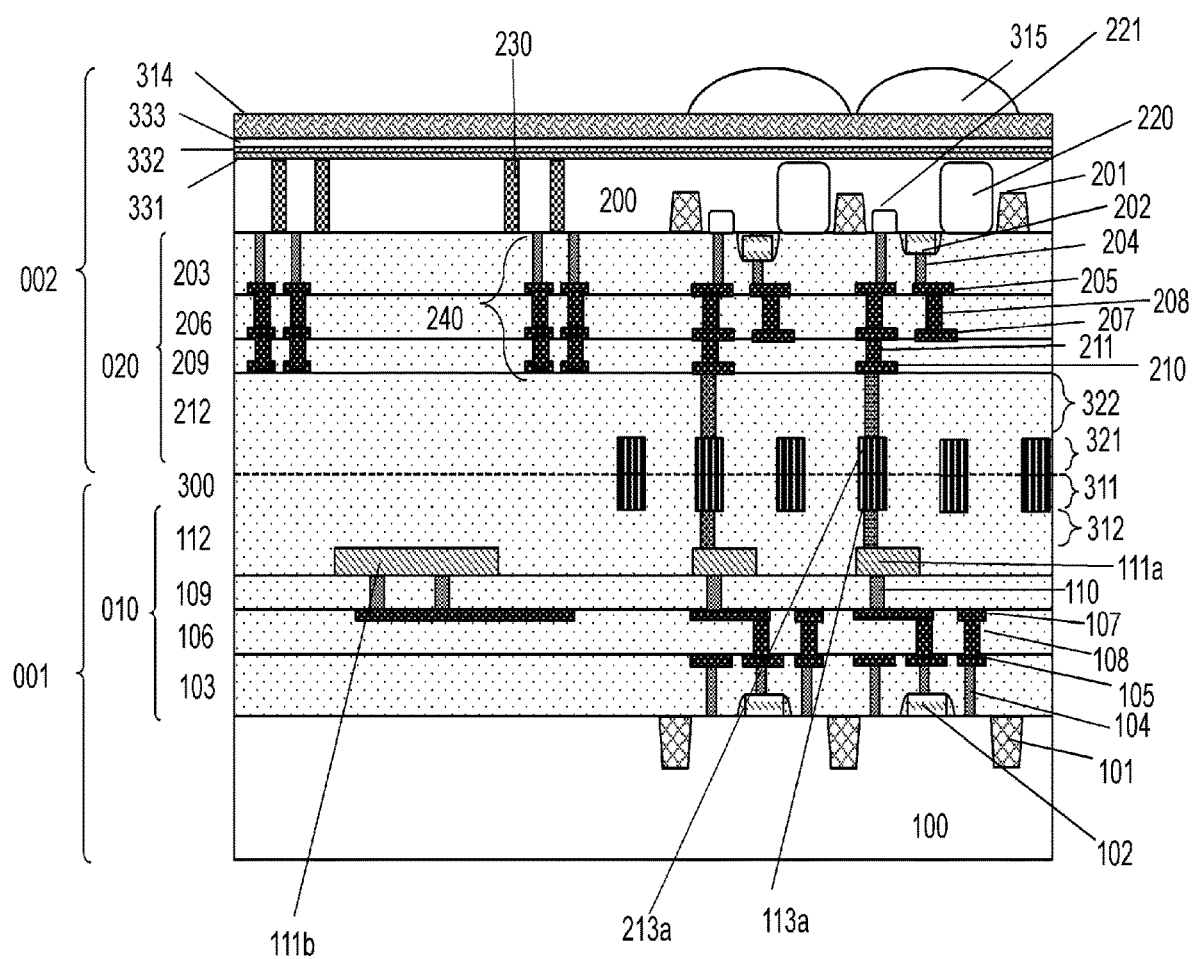
FIG. 10 is a cross-sectional view showing the production steps of the semiconductor device according to Embodiment 1.

In S1302, as shown in FIG. 10, the semiconductor layer 200 of the second semiconductor component 002 is thinned to a thickness (length in the vertical direction) of about several tens to several micron. The thinning method can be exemplified by back grinding, chemical mechanical polishing, etching and the like. Also, here, it is preferable to perform thinning until the isolation region 230 is exposed.

In S1303, as shown in FIG. 10, the metal oxide film 331, the antireflective film 332, and the insulating film 333 are formed on the upper surface of the semiconductor layer 200. The metal oxide film 331 is, for example, a hafnium oxide film, an aluminum oxide film, or the like. The antireflective film 332 is, for example, a tantalum oxide film or the like. The insulating film 333 may be arbitrarily selected from materials generally used in semiconductor devices. For example, the insulating film 333 is a silicon oxide film, a silicon nitride film, a silicon oxynitride film, a carbon-containing silicon oxide film, a fluorine-containing silicon oxide film, or the like. The layer configuration of the insulating film 333 may be a single-layer configuration made of one type of material, or a multilayer configuration made of a plurality of materials. Although not shown, for example, a light-shielding film for forming an OB region to be formed of a metal film such as tungsten, or a light-shielding wall for separation so that the light of each pixel is not mixed may be formed in the insulating film 333. The color filter 314 or the microlens 315 can also be formed on the semiconductor layer 200.

Figure 11:
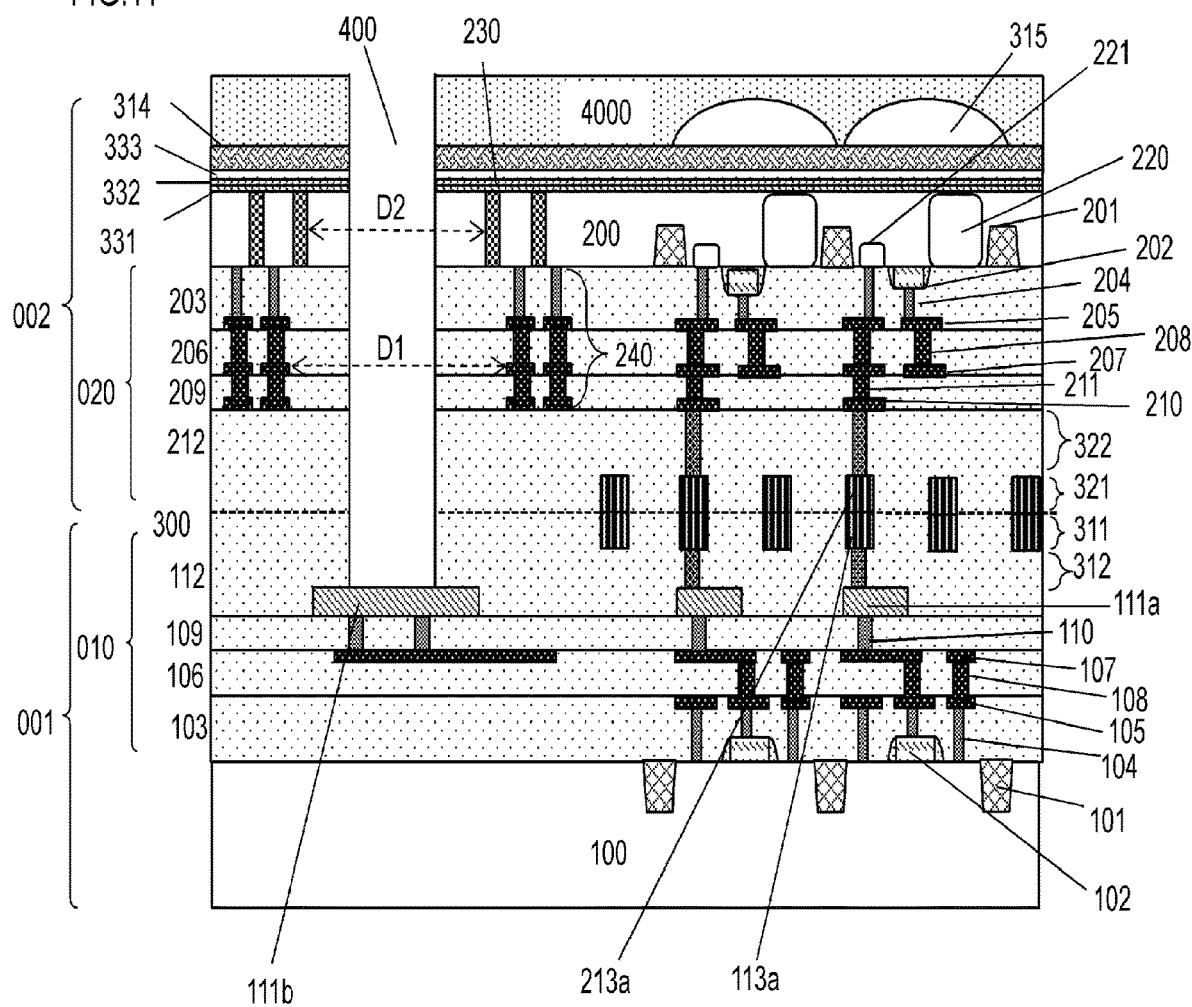
FIG. 11 is a cross-sectional view showing the production steps of the semiconductor device according to Embodiment 1.

In S1304, as shown in FIG. 11, an opening 400, which is a space penetrating from the uppermost layer surface of the stacked layers to the insulating film 112, is formed for connecting a connection member with the external connection electrode 111b. Etching is performed to form the opening 400, and a photoresist 4000 is used for the etching. The etching can be performed, for example, by dry etching. In the present embodiment, dry etching is used in both the etching of the wiring structure 020 and the etching of the semiconductor layer 200.

Here, the opening 400 is formed such that there are one or more isolation regions 230 at a distance to the opening 400 which is shorter than the distance between the opening 400 and the guard ring 240 closest to the opening 400. In other words, the opening 400 is formed such that the distance between the opening 400 and the guard ring 240 closest to the opening 400 is larger than the distance between the opening 400 and the isolation region 230 closest to the opening 400. Further, a spacing D1 of the guard rings 240 across the opening 400 is larger than a spacing D2 of the isolation regions 230 across the opening 400. Since the isolation region 230 is thus present on the outer periphery of the opening 400, the influence of charge-up caused by dry etching of the elements in the semiconductor layer 200 can be reduced. In addition, since the guard ring 240 is also provided on the outer periphery of the isolation region 230, the possibility of the guard ring 240 being broken down due to the influence of charge-up can be reduced.

In S1305, the semiconductor device APR is formed through a post-assembly step such as forming a conductive member connected to the external connection electrode 111b in the opening 400 by dicing or wire bonding.

In the present embodiment, the external connection electrode 111b is formed in the wiring structure 010 of the first semiconductor component 001. However, the present invention is not limited to such a configuration, and the external connection electrode 111b may be formed in the wiring structure 020 of the second semiconductor component 002. By forming the external connection electrode 111b in the wiring structure 020 of the second semiconductor component 002, the opening 400 can be made shallow. Also, for example, when the external connection electrode 111b is formed in the wiring structure 020 of the second semiconductor component 002, a glass substrate as a simple support substrate may be used instead of the first semiconductor component 001 and the semiconductor layer 100. That is, in such a case, the semiconductor layer 100 and the wiring structure 010 are unnecessary.

As described above, according to the present embodiment, the possibility of causing breakdown of elements in the semiconductor layer 200 or breakdown of the guard ring due to the influence of static electricity generated when passing through the production steps is reduced.

Apparatus EQP

The apparatus EQP provided with the semiconductor device APR shown in FIG. 1 will be described in detail below. Here, as described above, in addition to the semiconductor device IC having the semiconductor layer 100, the semiconductor device APR can include a package PKG accommodating the semiconductor device IC. The package PKG can include a substrate on which the semiconductor device IC is fixed, a lid body such as glass facing the semiconductor device IC, and a connection member such as a bonding wire or a bump for connecting the terminal provided on the substrate and the terminal provided on the semiconductor device IC.

The apparatus EQP can include at least one of the optical system OPT, the control device CTRL, the processing device PRCS, the display device DSPL, and the storage device MMRY. The optical system OPT forms an image on the semiconductor device APR, and is, for example, a lens, a shutter, or a mirror. The control device CTRL controls the semiconductor device APR, and is, for example, a photoelectric conversion device such as an ASIC.

The processing device PRCS processes the signal outputted from the semiconductor device APR. The processing device PRCS is a photoelectric conversion device such as a CPU or an ASIC for configuring an AFE (analog front end) or a DFE (digital front end). The display device DSPL is an EL display device or a liquid crystal display device that displays information (image) obtained by the semiconductor device APR. The storage device MMRY is a magnetic device or a semiconductor device that stores information (image) obtained by the semiconductor device APR. The storage device MMRY is a volatile memory such as SRAM or DRAM, or a non-volatile memory such as a flash memory or a hard disk drive.

The mechanical device MCHN has a movable unit or a propulsion unit such as a motor or an engine. In the apparatus EQP, a signal outputted from the semiconductor device APR is displayed on the display device DSPL, or externally transmitted by a communication device (not shown) included in the apparatus EQP. Therefore, the apparatus EQP preferably further includes a storage device MMRY and a processing device PRCS separately from the memory circuit and the arithmetic circuit of the semiconductor device APR. The mechanical device MCHN may be controlled based on a signal outputted from the semiconductor device APR.

Further, the apparatus EQP is suitable for an electronic device such as an information terminal (for example, a smartphone or a wearable terminal) having an image capturing function and a camera (for example, an interchangeable lens camera, a compact camera, a video camera, or a surveillance camera). The mechanical device MCHN in the camera can drive the components of the optical system OPT for zooming, focusing and shutter operations.

Also, the apparatus EQP may be a transportation apparatus such as a vehicle, a ship, or an aircraft. The mechanical device MCHN in the transportation apparatus can be used as a transfer device. The apparatus EQP as the transportation apparatus is suitable for transporting the semiconductor device APR, and performing assistance and/or automation of operation (steering) by an image capturing function. The processing device PRCS for assistance and/or automation in driving (steering) can perform processing for operating the mechanical device MCHN as a transfer device based on the information obtained by the semiconductor device APR. Alternatively, the apparatus EQP may be a medical device such as an endoscope, a measurement device such as a distance measurement sensor, or an analysis device such as an electron microscope.

Effects

According to this embodiment, since the guard ring can be prevented from operating as an antenna, the possibility of acquiring static electricity or plasma and affecting the semiconductor device can be suppressed. Furthermore, the possibility of causing breakdown of semiconductor components or breakdown of a guard ring that can be created by charge-up by plasma at the time of forming the opening by performing dry etching on the semiconductor layer can be reduced. Therefore, the reliability of the semiconductor device is improved.

Therefore, where the semiconductor device according to the present embodiment is used, the performance of the semiconductor device can be improved. As a result, for example, when the semiconductor device is mounted on a transportation apparatus to capture images outside the transportation apparatus and to measure the external environment, excellent image quality and measurement accuracy can be obtained. Therefore, when manufacturing and selling the transportation apparatus, it is advantageous to determine that the semiconductor device according to the present embodiment be mounted on the transportation apparatus in order to enhance the performance of the transportation apparatus itself.

Modification Example 1

Figure 12:
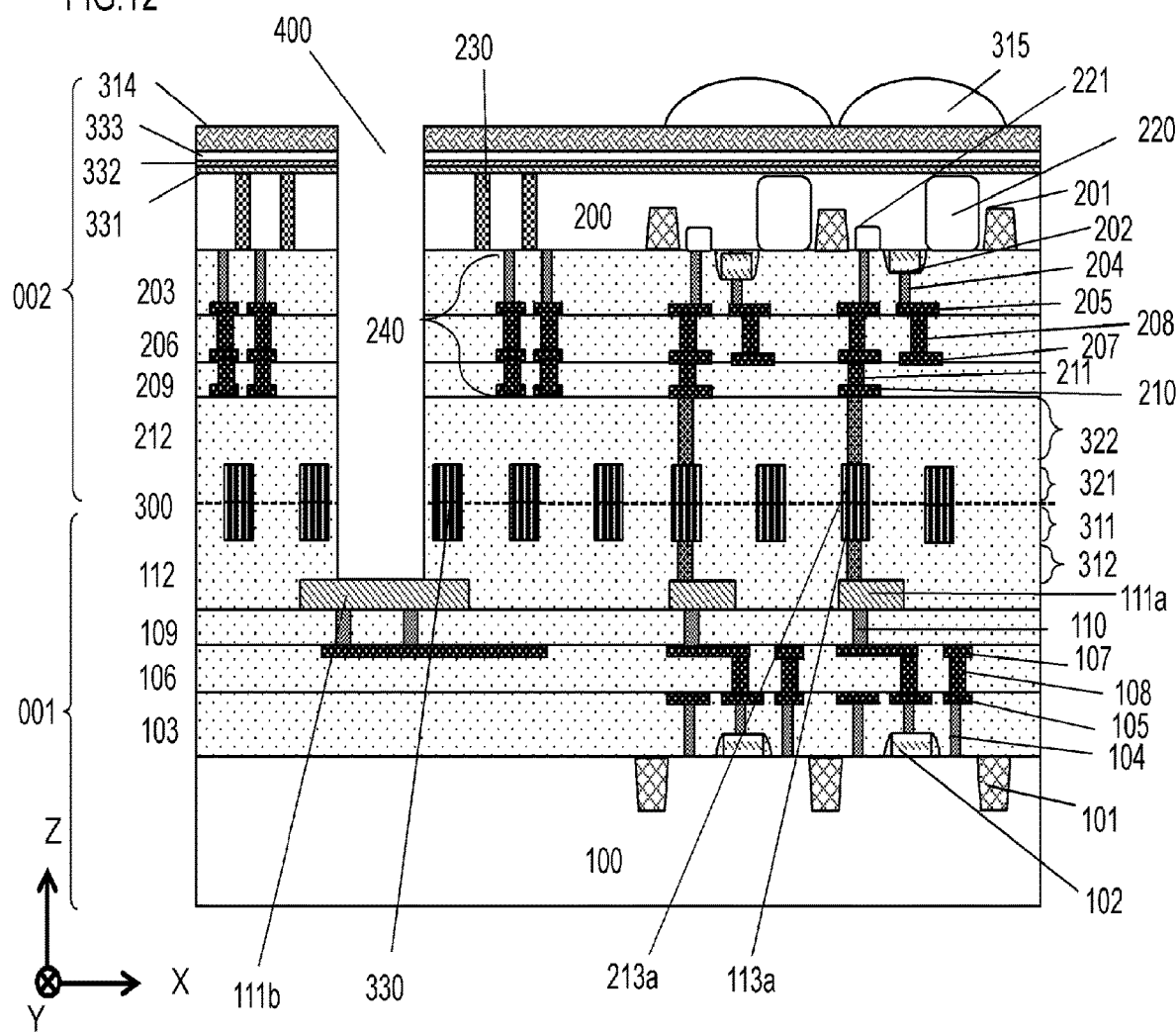
FIG. 12 is a cross-sectional view of the semiconductor device according to Modification Example 1.

In the semiconductor device APR according to Modification Example 1, as shown in FIG. 12, a bonding portion 330 located between the conductor portion 113a and the conductor portion 213a is provided in the vicinity of the external connection electrode 111b in the semiconductor device APR. That is, the first semiconductor component 001 and the second semiconductor component 002 in the semiconductor device APR have respective conductor portions 113a and 213a at a distance to the opening 400 which is shorter than the distance between the opening 400 and the guard ring 240 closest to the opening 400. The first semiconductor component 001 and the second semiconductor component 002 are not limited to the case where one conductor portion 113a and one conductor portion 213a satisfying this condition are provided in the respective semiconductor components, and two or more conductor portions may be provided. The distance between the opening 400 and the conductor portions 113a and 213a may be shorter or longer than the distance between the opening 400 and the isolation region 230.

Figure 13A:
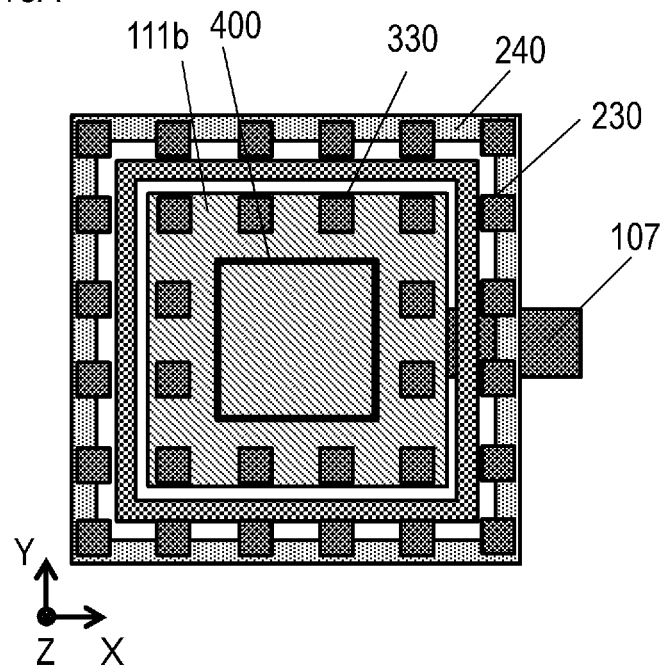
FIGS. 13A and 13B are transparent plan views of the semiconductor device according to Modification Example 1.
Figure 13B:
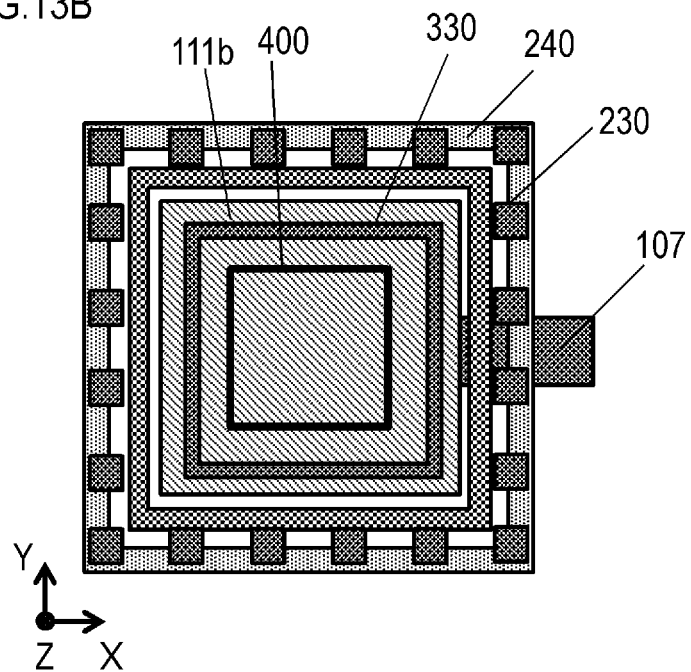

FIGS. 13A and 13B are transparent plan views seen from above of the arrangement relationship between the opening 400, the isolation regions 230, the guard rings 240, the external connection electrode 111b, and the bonding portions 330 of the semiconductor device APR shown in FIG. 12. In FIG. 13A, the bonding portions 330 are periodically arranged at regular intervals. Further, as shown in FIG. 13B, the bonding portion 330 may have a ring shape surrounding the opening 400.

Since the strength of bonding of the conductors tends to be larger than that of bonding of the insulators, by providing the bonding portion 330 close to the opening 400 in this manner, the bonding strength of the bonding interface in the opening 400 can be increased. Therefore, defects due to peeling of the bonding interface caused by the stress generated at the time of wire bonding can be reduced.

Modification Example 2

Figure 14:
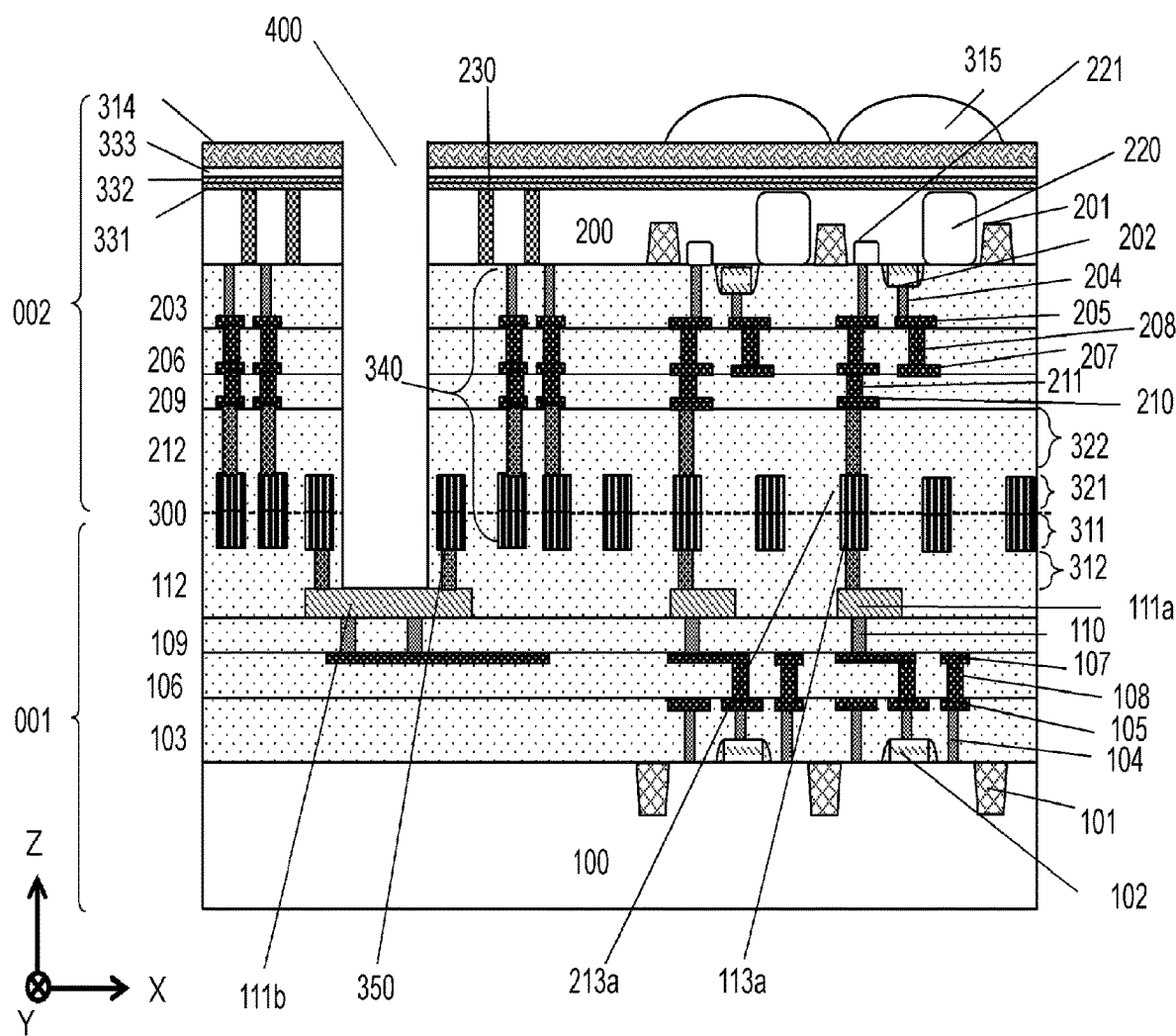
FIG. 14 is a cross-sectional view of the semiconductor device according to Modification Example 2.

In the semiconductor device APR according to Modification Example 2, as shown in FIG. 14, a guard ring 340 includes the contact plug 204, the wiring layer 205, the via plug 208, the wiring layer 207, the via plug 211, the wiring layer 210, and the bonding region 311. That is, the guard ring 340 has a configuration in which the guard ring 240 in Embodiment 1, the conductor portion 113a and the conductor portion 213a are connected. Further, in the semiconductor device APR according to the present Modification Example, a second guard ring 350 connected on the external connection electrode 111b is formed. The second guard ring 350 is configured to include the connection region 312 and the bonding region 311 in the conductor portion 113a, and the bonding region 321 in the conductor portion 213a. That is, the second guard ring 350 can be formed by bonding the connection region 312 and the bonding region 311 with the bonding region 321, and is configured, for example, of copper as a main component.

FIG. 13C is a transparent plan view seen from above of the arrangement relationship between the opening 400, the isolation regions 230, the guard ring 340, the second guard ring 350, and the external connection electrode 111b of the semiconductor device APR shown in FIG. 14. In the present Modification Example, in the arrangement of the semiconductor device APR as viewed from above, the second guard ring 350 is arranged at the outer periphery of the opening 400, the isolation region 230 is arranged at the outer periphery of the second guard ring 350, and the guard ring 340 is arranged at outer periphery of the isolation region 230. That is, the second guard ring 350 is arranged between the opening 400 and the guard ring 340 closest to the opening 400.

Thus, by providing the second guard ring 350 close to the opening 400, the bonding strength of the bonding interface in the opening 400 is increased, and the defects due to peeling of the bonding interface caused by the stress generated at the time of wire bonding can be reduced. In addition, because of the configuration in which the guard ring 340 and the second guard ring 350 are arranged to surround the opening 400, it is possible to suppress the entry of moisture into the element region, and protect the elements from moisture and ions.

Modification Example 3

Figure 15:
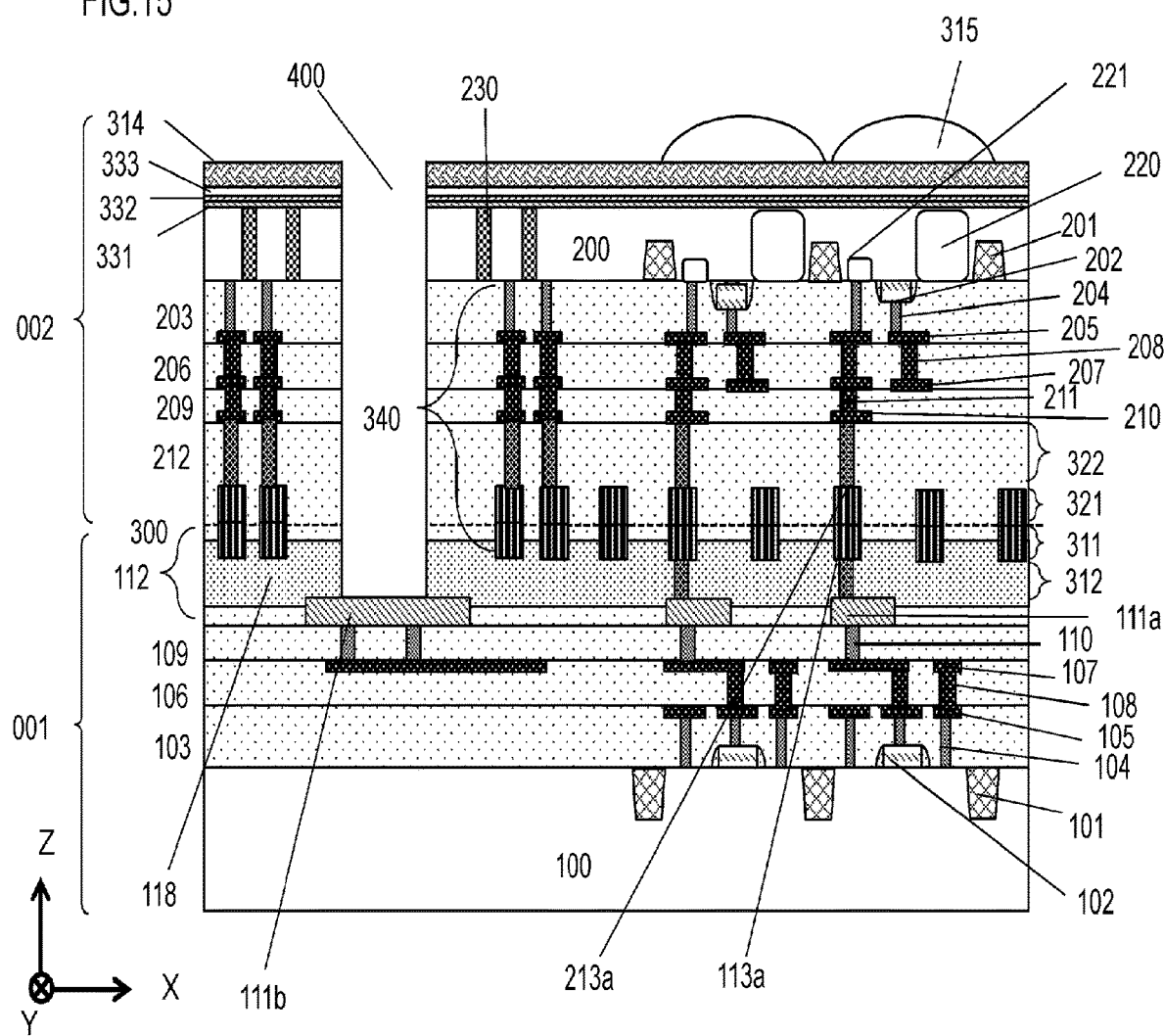
FIG. 15 is a cross-sectional view of the semiconductor device according to Modification Example 3.

In the semiconductor device APR according to Modification Example 3, as shown in FIG. 15, the guard ring 340 is configured in the same manner as in Modification Example 2. In addition, in the configuration of the insulating film 112, an insulating film 118 which functions as a passivation film is formed in a portion between the wiring layer 111a (the external connection electrode 111b) and the bonding region 311. More specifically, the insulating film 118 which is a passivation film is arranged between the guard ring 340 and the external connection electrode 111b. The insulating film 118 is, for example, a silicon compound film including nitrogen (for example, SiN or SiON).

Figure 16A:
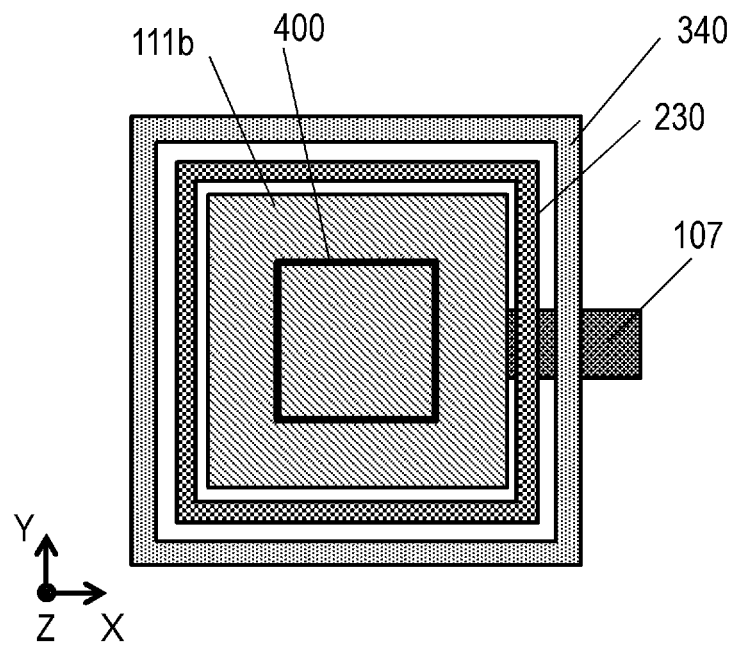
FIG. 16A is a transparent plan view of the semiconductor device according to Modification Example 3.

FIG. 16A is a transparent plan view seen from above of the arrangement relationship between the opening 400, the isolation regions 230, the guard ring 340, and the external connection electrode 111b of the semiconductor device APR shown in FIG. 15. Here, the arrangement relationship is the same as that in which the guard ring 240 of the arrangement relationship shown in FIG. 3 in Embodiment 1 is replaced with the guard ring 340.

As described above, by forming a part of the insulating film 112 with a passivation film, a configuration is obtained in which the opening 400 is surrounded by the guard ring 340 and the passivation film. Therefore, entry of moisture into the element region can be suppressed, and the elements can be protected from moisture and ions.

Modification Example 4

Figure 17:
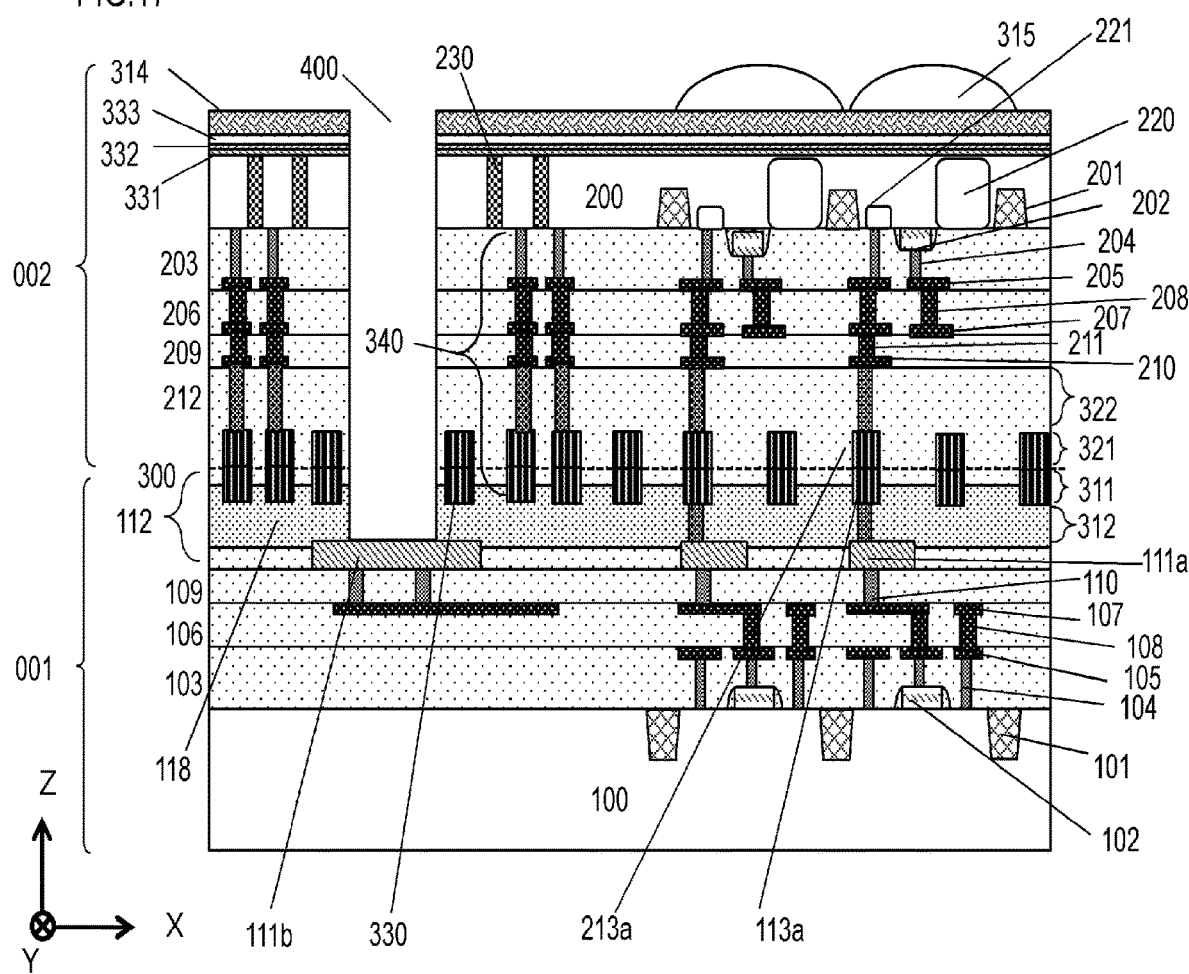
FIG. 17 is a cross-sectional view of the semiconductor device according to Modification Example 4.

In the semiconductor device APR according to Modification Example 4, as shown in FIG. 17, constituent components of Modification Examples 1 to 3 are combined. Specifically, the semiconductor device APR according to Modification Example 4 has the bonding portions 330 close to the opening 400 in the same manner as in Modification Example 1, has the guard ring 340 similar to that of Modification Example 2, and has an insulating film 118 in the same manner as in Modification Example 3.

Figure 16B:
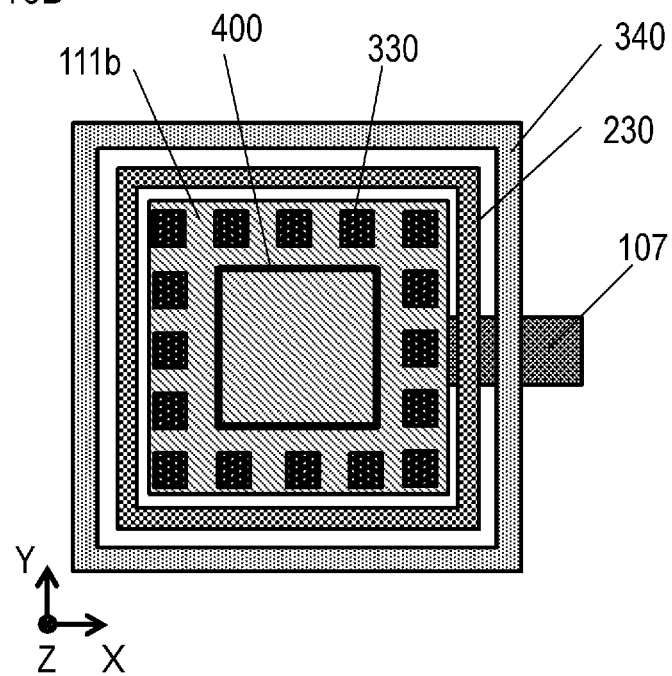

FIGS. 16B and 16C are transparent plan views seen from above of the arrangement relationship between the opening 400, the isolation regions 230, the guard ring 340, the external connection electrode 111b and the bonding portions 330 of the semiconductor device APR shown in FIG. 17. Here, as shown in FIG. 16B, the bonding portions 330 are arranged periodically. Further, as shown in FIG. 16C, the bonding portion 330 may have a ring shape so as to surround the opening 400. As a result, the respective effects described in Modification Examples 1 to 3 can be obtained at the same time.

Embodiment 2

In Embodiment 1, the influence of static electricity on the semiconductor layer is suppressed by the positional relationship between the guard ring and the isolation region in the vicinity of the opening in the semiconductor device APR. Meanwhile, described in Embodiment 2 is a method for producing a semiconductor device APR in which an opening in a semiconductor layer is formed by wet etching, thereby making it possible to suppress the influence of static electricity on the semiconductor layer occurring when the opening is formed. Hereinbelow, a method for producing the first semiconductor component 001 and the second semiconductor component 002 is described and then a method producing the semiconductor device APR using the two semiconductor components is described. In the following production methods, the semiconductor device APR or the like may be produced by a person, or the production method may be performed by a production apparatus or the like.

The method for producing the first semiconductor component 001 and the second semiconductor component 002 may be the same as in Embodiment 1. Further, each insulating film denoted by a reference numeral described below is an interlayer insulating film, and can be arbitrarily selected from materials generally used in a semiconductor device. For example, each insulating film is a silicon oxide film, a silicon nitride film, a silicon oxynitride film, a carbon-containing silicon oxide film, a fluorine-containing silicon oxide film, or the like. The layer configuration of each insulating film may be a single-layer configuration made of one type of material, or a multilayer configuration made of a plurality of materials.

Method for Producing First Semiconductor Component 001

Hereinafter, a method for producing the first semiconductor component 001 is described with reference to the flowchart shown in FIG. 18A. The first semiconductor component 001 produced according to the flowchart shown in FIG. 18A is substantially similar to the first semiconductor component described with reference to FIG. 6B, and FIGS. 5A to 6B can be referred to regarding the reference numerals in the following description.

In S2101, first, the component P1 is prepared. The component P1 includes the semiconductor layer 100, the element isolations 101, the gate electrodes 102, the insulating film 103, the contact plugs 104, the wiring layer 105, the insulating film 106, the wiring layer 107, and the via plugs 108 connecting the wiring layer 105 and the wiring layer 107. Although the MOS transistor is disposed on the surface of the semiconductor layer 100, the present embodiment, similarly to Embodiment 1, is not limited to such a configuration.

In S2102, the insulating film 109 is formed on the insulating film 106.

In S2103, grooves are formed by etching from the surface of the insulating film 109, a conductor is formed over the entire surface of the insulating film 109 by PVD or CVD, and the grooves are filled with the conductor. Thereafter, the conductor on the surface of the insulating film 109 is removed by chemical mechanical polishing, etch back, or the like, whereby the via plugs 110 are formed in the insulating film 109.

In S2104, the conductor 111 is formed on the insulating film 109. The material of the conductor 111 may be aluminum or the like.

In S2105, the conductor 111 is patterned. The patterning can be performed by photolithography and etching. By the patterning, a part of the conductor 111 is formed as the wiring layer 111a, and a part is formed as the external connection electrode 111b.

In S2106, the insulating film 112 is formed on the insulating film 109. For example, after forming a silicon oxide film, planarization is performed by chemical mechanical polishing, and a silicon nitride film is formed thereon to form an insulating film 112 composed of two types of films and having a planarized surface.

In S2107, grooves 113 for embedding the metal structure and grooves 114 for embedding the via connecting the metal structure and the wiring layer 111a are formed in the insulating film 112. The grooves 113 and the grooves 114 constitute recesses 1130 in Embodiment 1. The grooves 113 are arranged at an appropriate density outside the region for forming the opening.

In S2108, the conductor 115 is formed over the entire surface of the insulating film 112. At this time, the grooves 113 and the grooves 114 are filled with the conductor 115. The material of the conductor 115 may be copper.

In S2109, the conductor 115 above the insulating film 112 is removed by chemical mechanical polishing to form the conductor portions 113a and the via plugs 114a. Here, the via plug 114a connects the wiring layer 111a and the conductor portion 113a. As in Embodiment 1, the conductor portion 113a may have the via plug 114a. Thus, the first semiconductor component 001 including the semiconductor layer 100 and the wiring structure 010 before bonding is formed.

Method for Producing Second Semiconductor Component 002

Hereinafter, a method for producing the second semiconductor component 002 will be described with reference to the flowchart shown in FIG. 18B. The second semiconductor component 002 manufactured according to the flowchart shown in FIG. 18B is substantially similar to the second semiconductor component shown in FIG. 8B, and FIGS. 7A to 8B can be referred to regarding the reference numerals in the following description.

In S2201, a groove 216 for separating a region for forming an opening and other elements is formed by etching in the semiconductor layer 200. The groove 216 has a depth of about several tens to several micrometers, and is arranged to surround the region for forming the opening.

In S2202, an insulating film 217 is formed over the entire surface of the semiconductor layer 200. At this time, the groove 216 is filled with the insulating film 217.

In S2203, the insulating film 217 above the semiconductor layer 200 is removed by chemical mechanical polishing, etch back, or the like, and the isolation region 230 is formed at a location corresponding to the groove 216.

In S2204, the component P2 is prepared. The component P2 has the semiconductor layer 200 having the isolation region 230 formed in S2203. The component P2 further includes the element isolations 201, the transfer gates 202, the insulating film 203, the contact plugs 204, the wiring layer 205, the insulating film 206, the wiring layer 207, the via plugs 208, the insulating film 209, the wiring layer 210, and the via plugs 211. Here, the via plugs 208 connect the wiring layer 205 and the wiring layer 207, and the via plugs 211 connect the wiring layer 207 and the wiring layer 210. Some of the contact plugs 204 are guard rings 240. The guard rings 240 are disposed to surround the outer periphery of the isolation region 230. Although the MOS transistor is disposed on the surface of the semiconductor layer 200, the present embodiment, similarly to Embodiment 1, is not limited to such a configuration.

In S2205, the insulating film 212 is formed on the insulating film 209.

In S2206, the grooves 213 for embedding the metal structure and the grooves 214 for embedding the via connecting the metal structure and the wiring layer 210 are formed in the insulating film 212. The grooves 213 are arranged at an appropriate density outside the region for forming the opening.

In S2207, the conductor 215 is formed over the entire surface of the insulating film 212. At this time, the grooves 213 and the grooves 214 are filled with the conductor 215. The material of the conductor 215 may be copper.

In S2208, the conductor 215 present above the insulating film 212 is removed by chemical mechanical polishing to form the conductor portions 213a, and the via plugs 214a connecting the wiring layer 210 and the conductor portions 213a. Thus, the second semiconductor component 002 including the semiconductor layer 200 and the wiring structure 020 before bonding is formed.

Method for Producing Semiconductor Device APR

Figure 19:
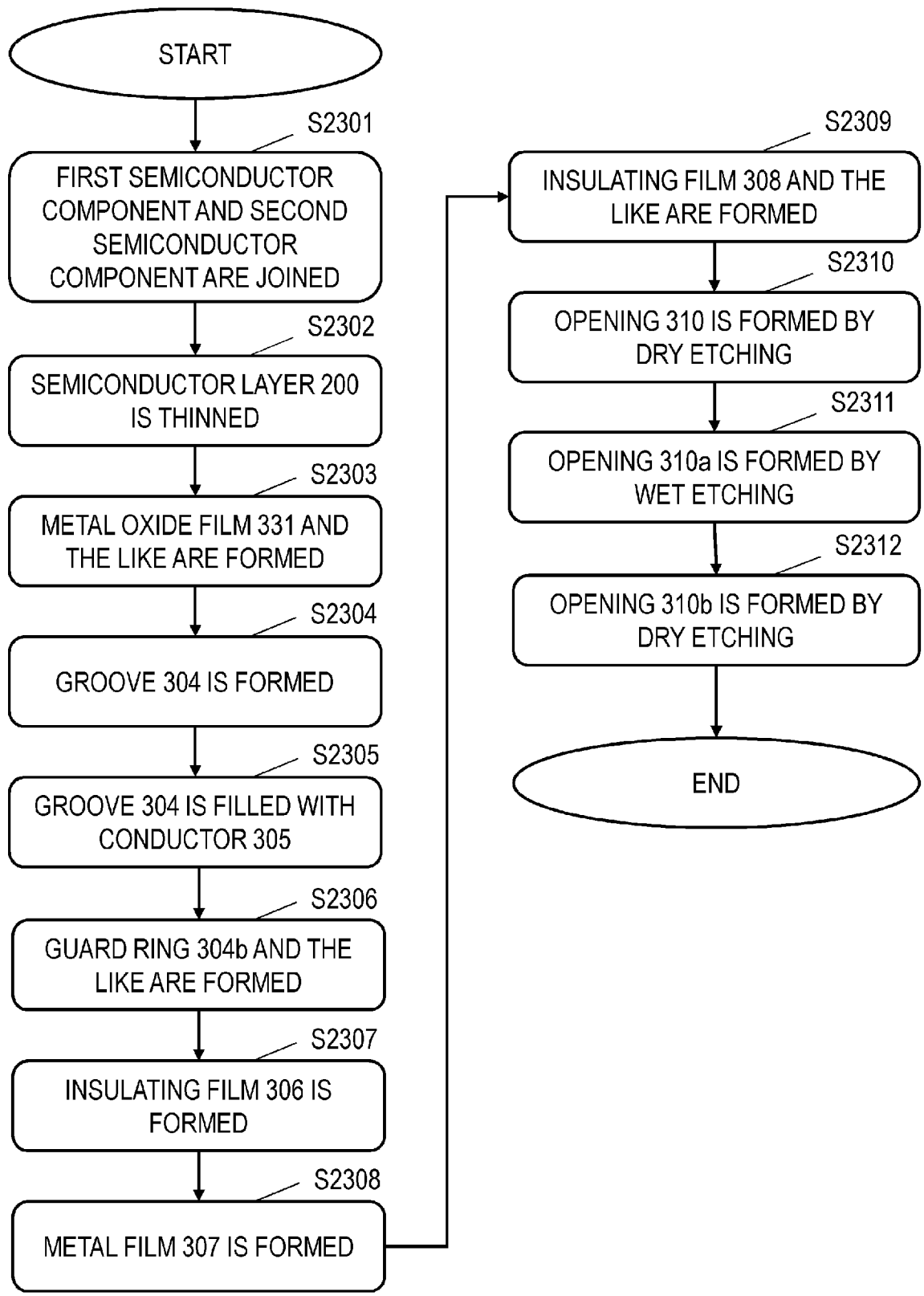
FIG. 19 is a flowchart showing a method for producing the semiconductor device according to Embodiment 2.

Hereinafter, a method for producing the semiconductor device APR according to the present embodiment will be described using the flowchart shown in FIG. 19.

In S2301, the second semiconductor component 002 is turned upside down in the same manner as shown in FIG. 9 in Embodiment 1, and the first semiconductor component 001 and the second semiconductor component 002 are bonded together. In the structure obtained after bonding, the second semiconductor component 002 is stacked on the first semiconductor component 001. The bonding surface 300 is a surface at which the first semiconductor component 001 and the second semiconductor component 002 are bonded. In such a manner, it is possible to prepare a member including the semiconductor layer 100, the semiconductor layer 200, and a wiring structure section configured of a plurality of stacked wiring layers and a plurality of stacked insulating films, the wiring structure section being arranged between the semiconductor layer 100 and the semiconductor layer 200.

Figure 20:
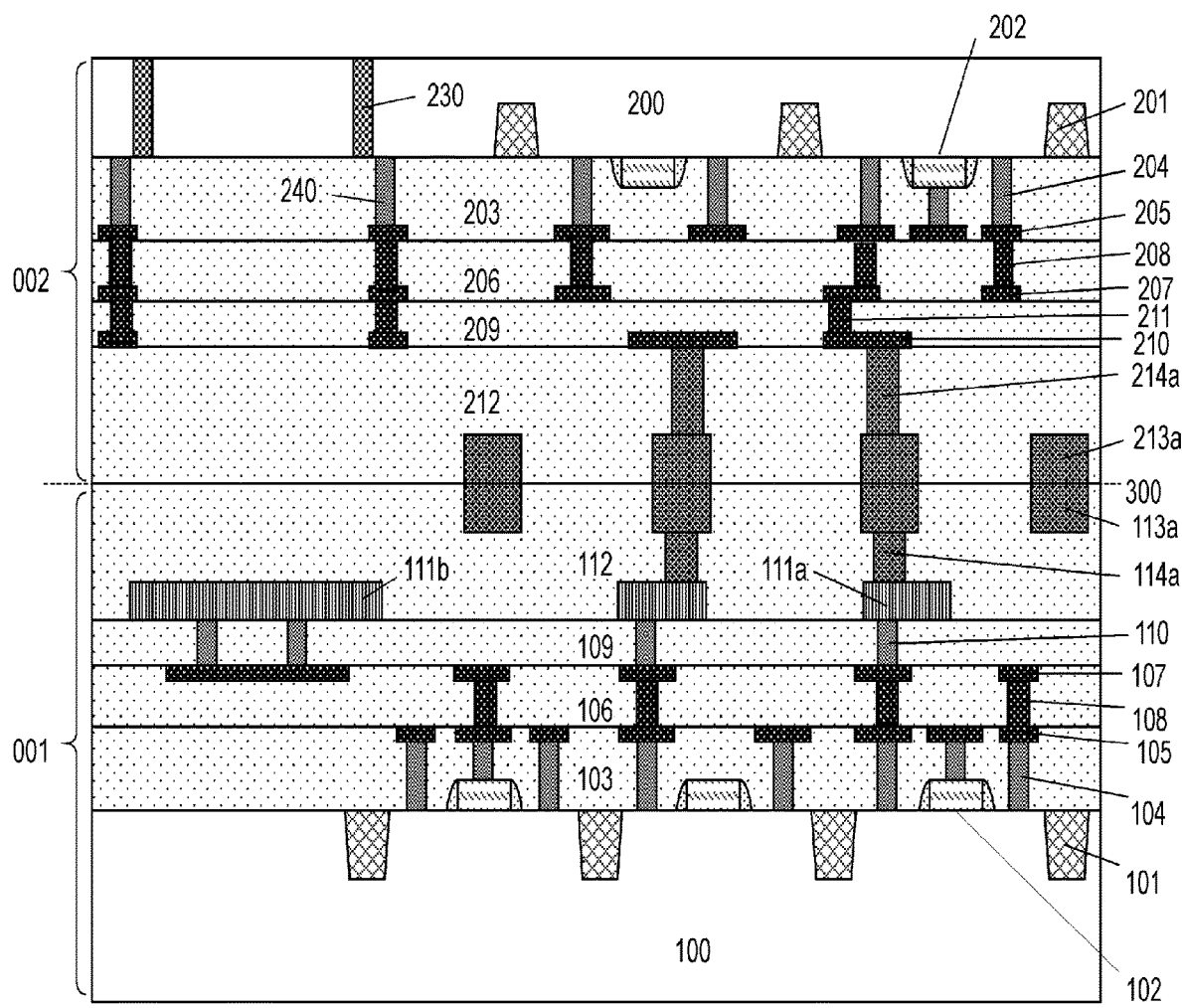
FIG. 20 is a cross-sectional view showing the production steps of the semiconductor device according to Embodiment 2.

In S2302, as shown in FIG. 20, the semiconductor layer 200 is thinned to a thickness of about several tens to several micron through which the isolation region 230 penetrates. The thinning method can be exemplified by back grinding, chemical mechanical polishing, etching and the like.

In S2303, a metal oxide film 301, an antireflective film 302, and an insulating film 303 are formed on the semiconductor layer 200. The metal oxide film 301 is, for example, a hafnium oxide film, an aluminum oxide film, or the like. The antireflective film 302 is, for example, a tantalum oxide film or the like.

Figure 21:
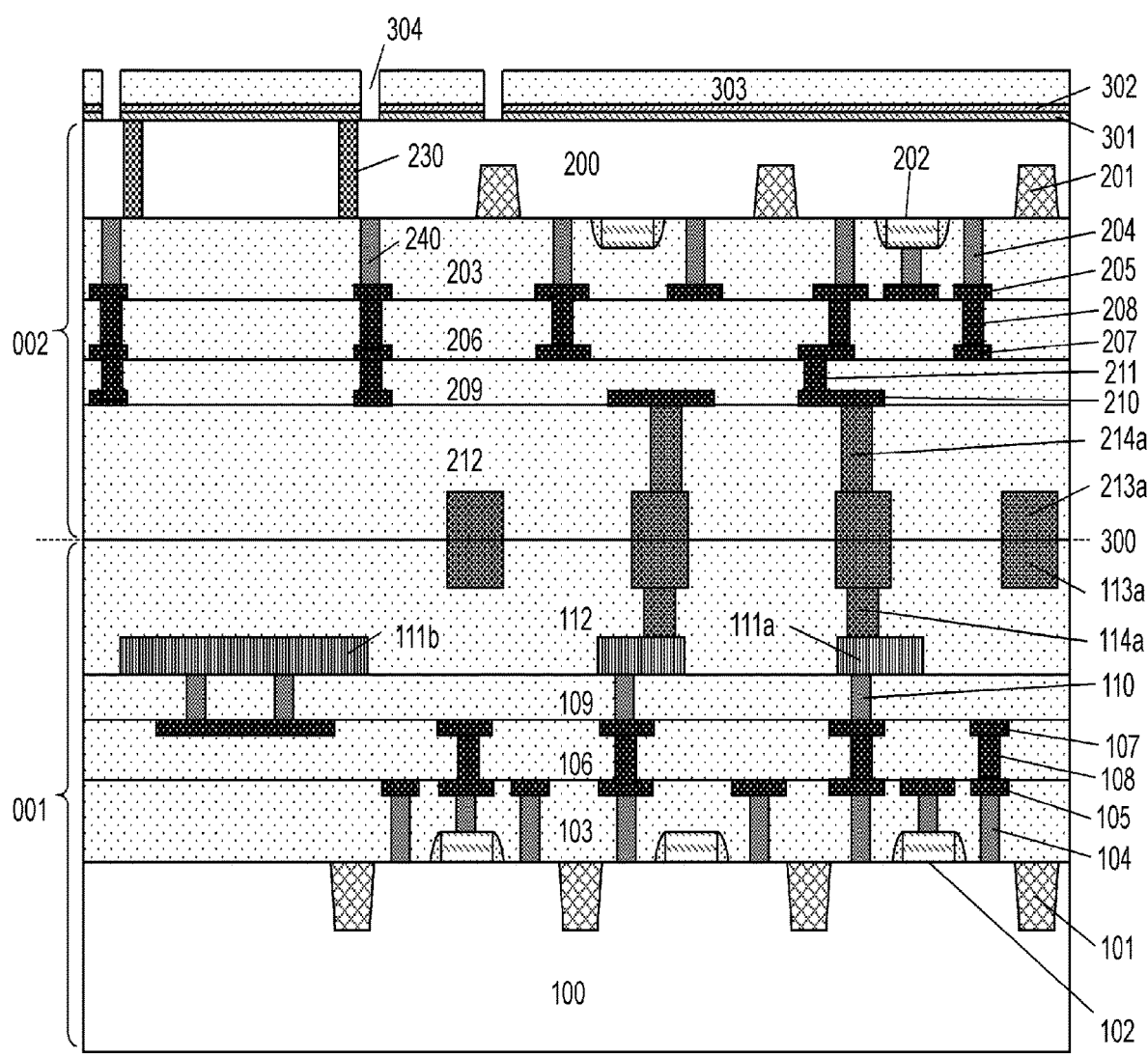
FIG. 21 is a cross-sectional view showing the production steps of the semiconductor device according to Embodiment 2.

In S2304, as shown in FIG. 21, a groove 304 for embedding a metal structure is formed in the insulating film 303.

In S2305, a conductor 305 is formed over the entire surface of the insulating film 303. At this time, the groove 304 is filled with the conductor 305. The material of the conductor 305 may be tungsten or the like.

In S2306, the conductor 305 is patterned. The patterning can be performed by photolithography and etching. By the patterning, a part of the conductor 305 is formed as the metal film 305a, and a part is formed as the guard ring 305b (metal ring). At the same time, a via plug 304a and a guard ring 304b connecting the metal film 305a and the semiconductor layer 200 are formed. The guard ring 304b is disposed to surround the outer periphery of the isolation region 230.

In S2307, an insulating film 306 is formed on the insulating film 303.

In S2308, grooves are formed by etching from the surface of the insulating film 306. Next, a conductor is formed over the entire surface of the insulating film 306 by PVD or CVD, and the grooves are filled with the conductor. Then, the conductor on the surface of the insulating film 306 is removed by chemical mechanical polishing, etch back, or the like, whereby a metal film 307 is formed inside the insulating film 306. Further, the number of metal film layers can be arbitrarily selected.

Figure 22:
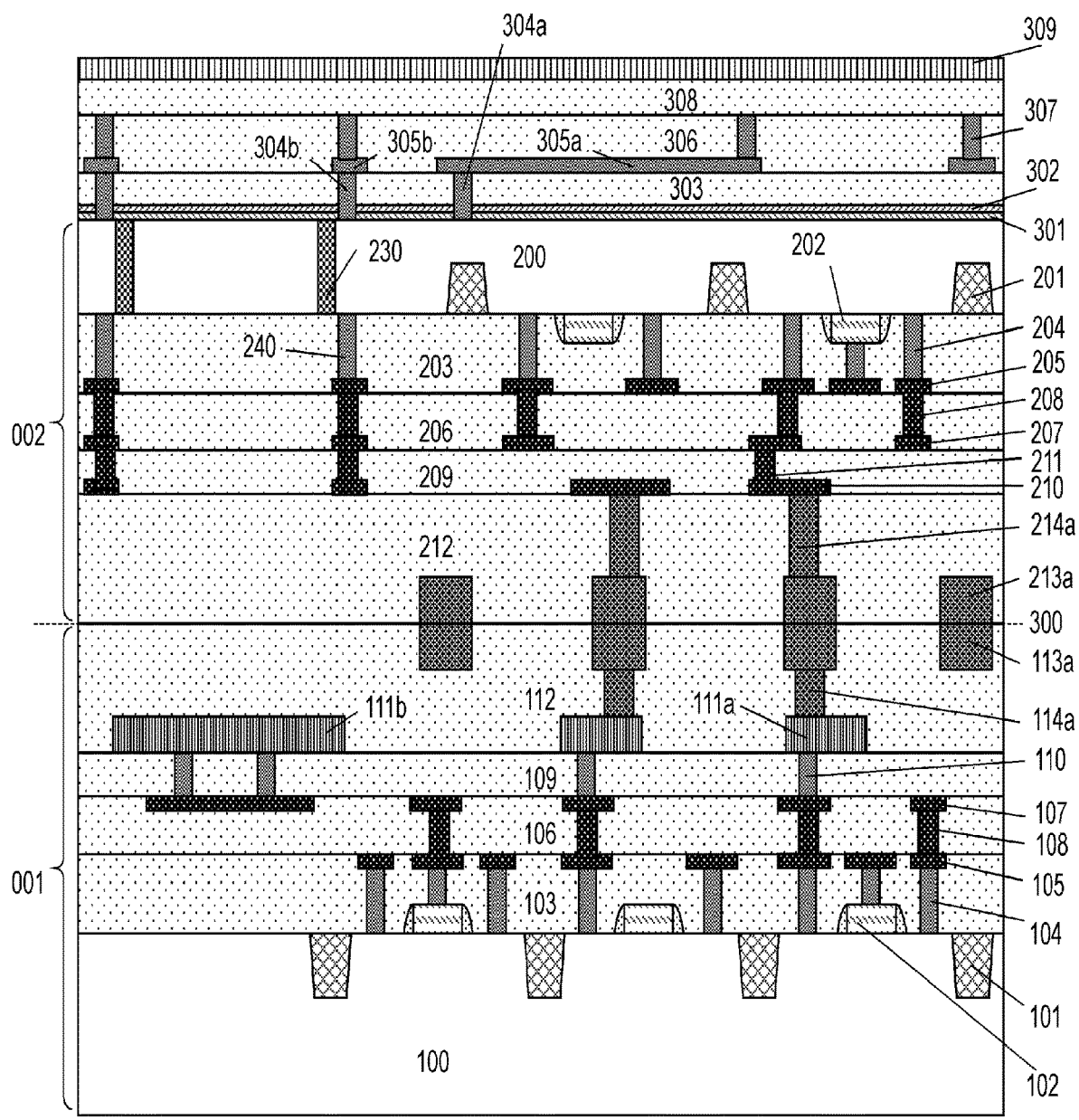
FIG. 22 is a cross-sectional view showing the production steps of the semiconductor device according to Embodiment 2.

In S2309, as shown in FIG. 22, an insulating film 308, a color filter 309, and a microlens (not shown) are formed on the insulating film 306.

Figure 23:
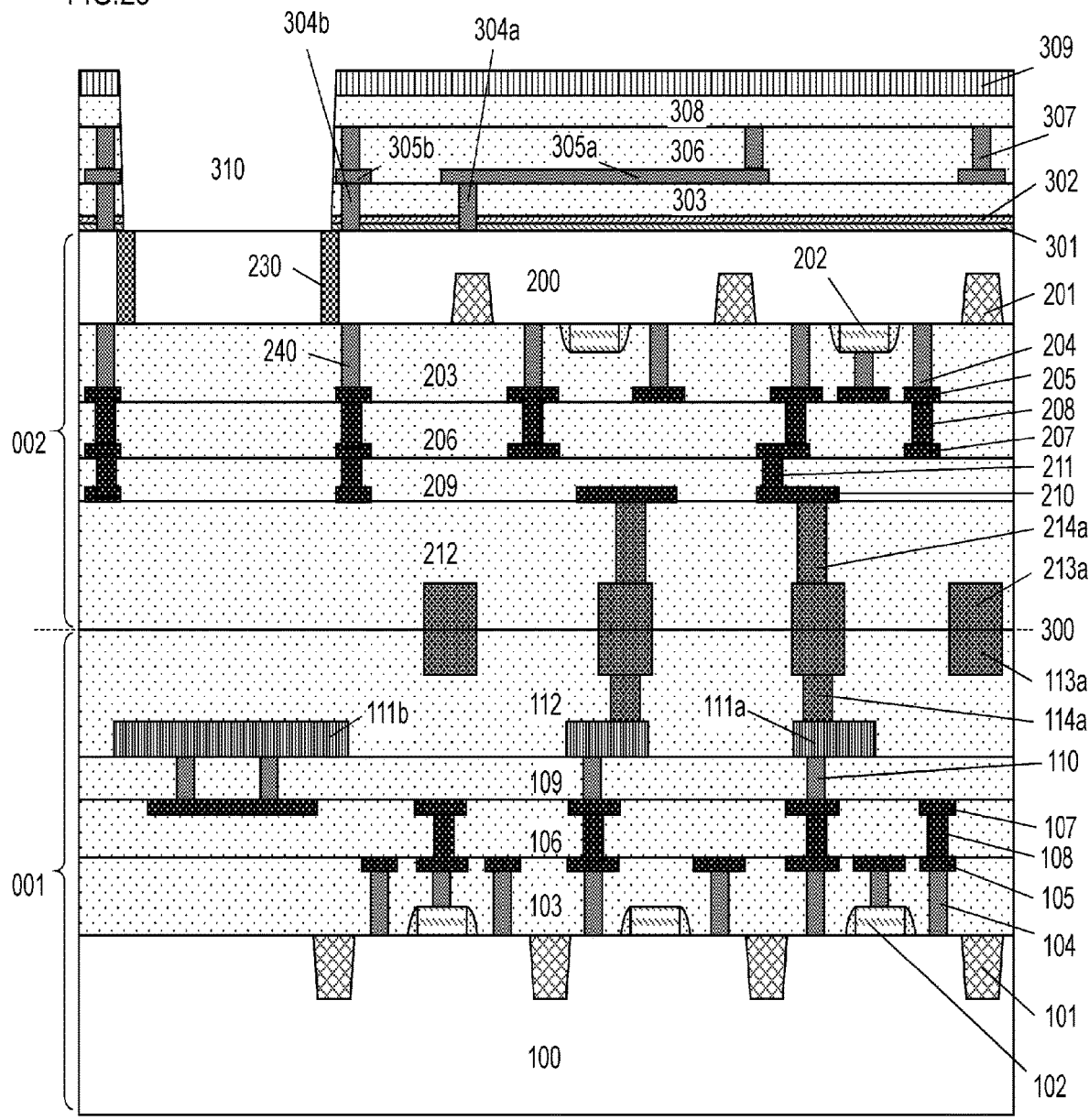
FIG. 23 is a cross-sectional view showing the production steps of the semiconductor device according to Embodiment 2.

In S2310, as shown in FIG. 23, an opening 310 is formed by dry etching in order to expose a part of the external connection electrode 111b from the surface of the uppermost layer of the stacked layers. At this time, the etching is stopped (etching stop) at the interface between the metal oxide film 301 and the semiconductor layer 200 by performing etching so that the etching rates (speed of etching) of the metal oxide film 301 and the semiconductor layer 200 are different.

Figure 24:
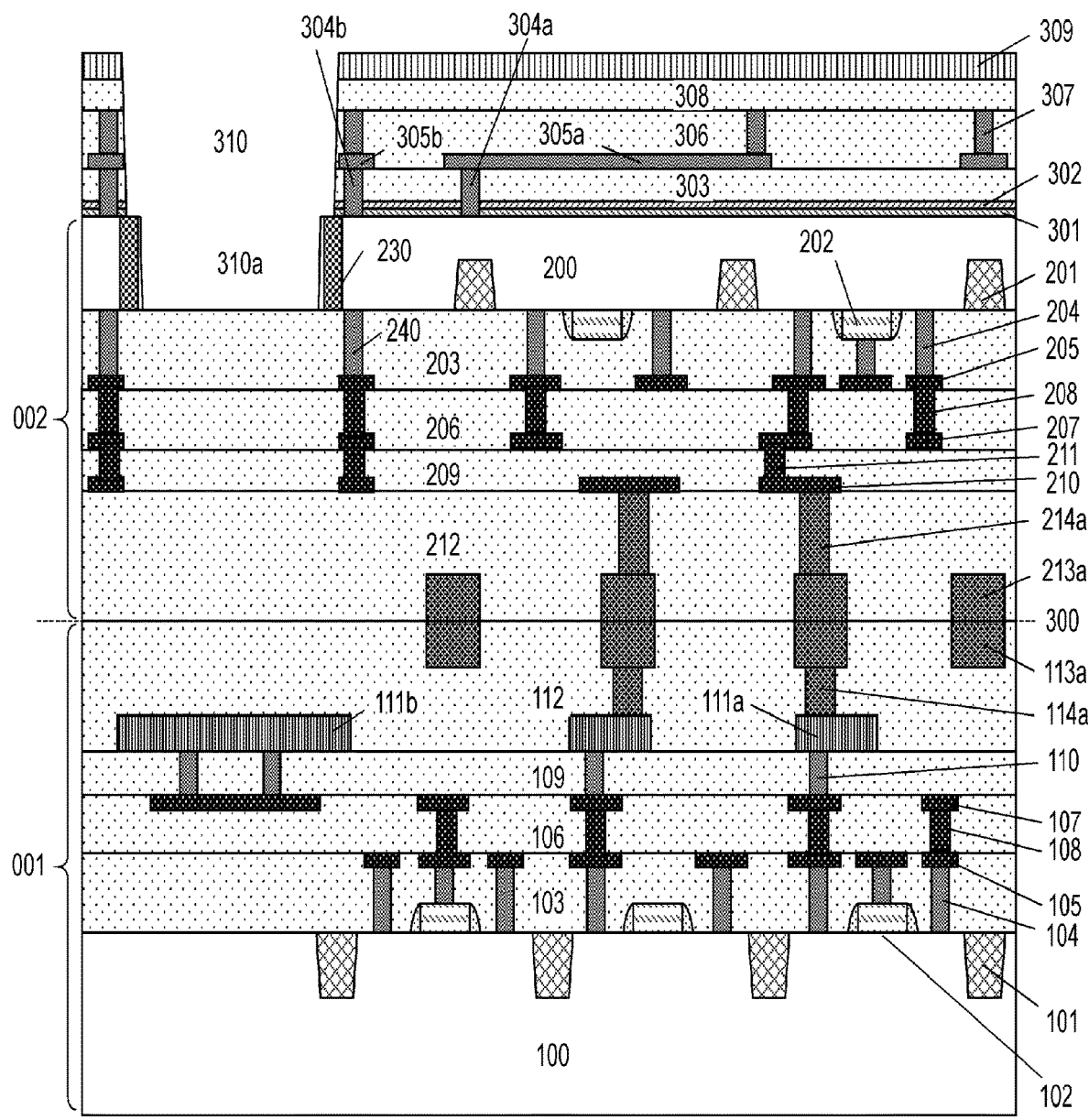
FIG. 24 is a cross-sectional view showing the production steps of the semiconductor device according to Embodiment 2.

In S2311, as shown in FIG. 24, the semiconductor layer 200 is subjected to wet etching to form the opening 310a. At this time, only the inner side surrounded by the isolation region 230 can be made into the opening 310a by performing etching so that the etching rates of the semiconductor layer 200 and the isolation region 230 are different. Fluoronitric acid, fluoro-nitric acid—acetic acid, and the like are preferable as a chemical solution to be used for wet etching.

Figure 25:
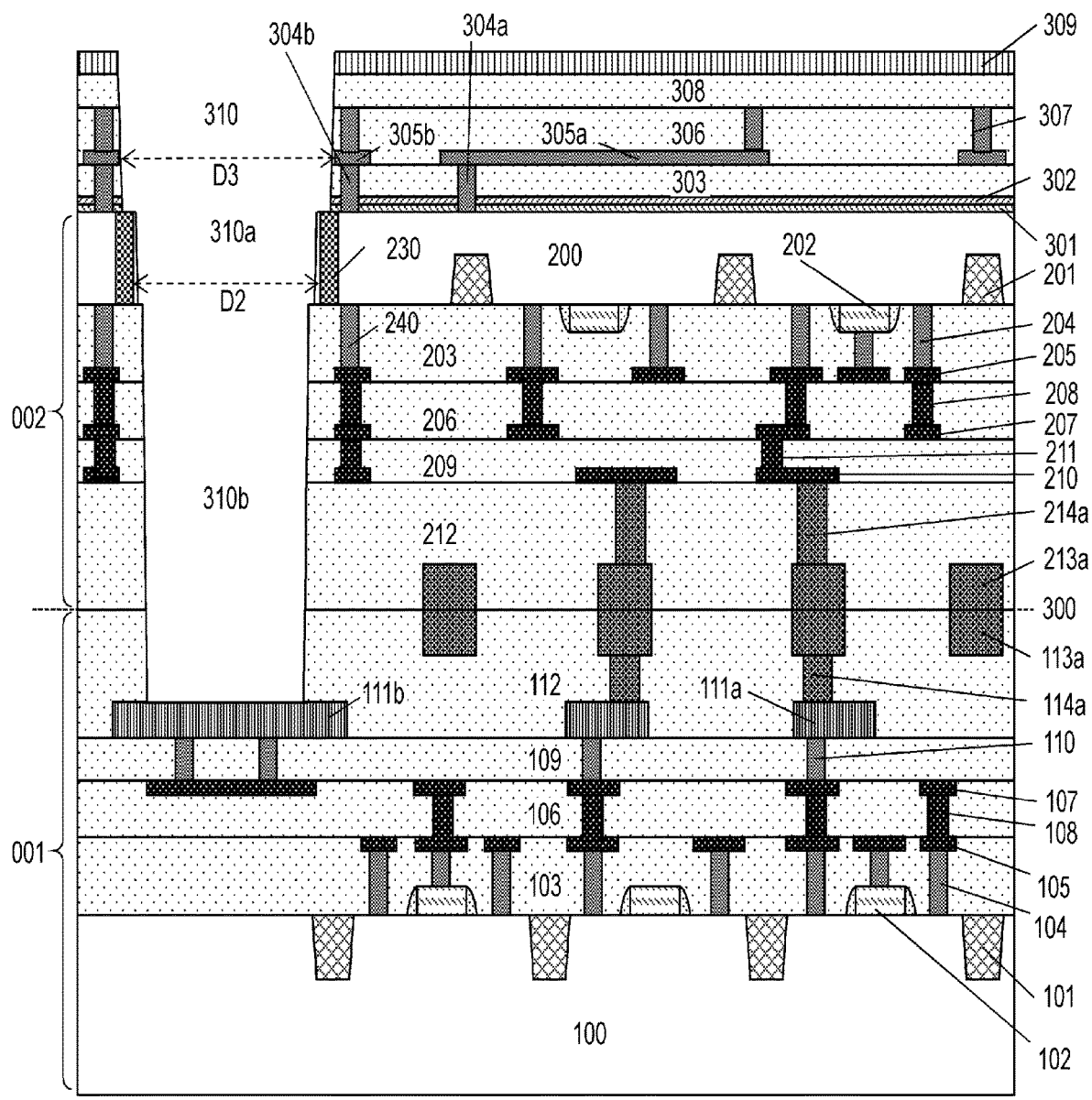
FIG. 25 is a cross-sectional view showing the production steps of the semiconductor device according to Embodiment 2.

In S2312, as shown in FIG. 25, an opening 310b is formed by performing dry etching on the second semiconductor component 002 and the insulating film 112 which have not been etched. Here, the guard ring 305b (metal ring) surrounds the outer periphery of the opening 310 in the insulating film 303 and the insulating film 306. Further, the distance between the opening 310b and the guard ring 240 closest to the opening 310b is larger than the distance between the opening 310 and the guard ring 305b (metal ring) closest to the opening 310. A spacing D2 of the isolation regions 230 across the opening 310a is smaller than a spacing D3 of the guard rings 305b across the opening 310. The configuration including the opening 310, the opening 310a, and the opening 310b corresponds to the opening 400 of Embodiment 1. Thus, the semiconductor device APR according to the present embodiment is formed.

In the present embodiment, the external connection electrode 111b is formed in the first semiconductor component 001, but this configuration is not limiting, and the external connection electrode 111b may be formed in the second semiconductor component 002.

Effects

As described above, in the present embodiment, because wet etching is used when forming the opening in the semiconductor layer, plasma damage occurring when dry etching is performed using plasma does not occur. Therefore, the reliability of the semiconductor device is improved. In addition, as a result of performing wet etching so that the etching rates of the semiconductor layer and the isolation region are different, the etching can be stopped by the isolation region even when an alignment error is caused by photolithography used to form the opening. The resulting effect is that the diameter of the opening of the semiconductor layer and the position of the opening can be easily controlled.

Modification Example 5

Figure 26A:
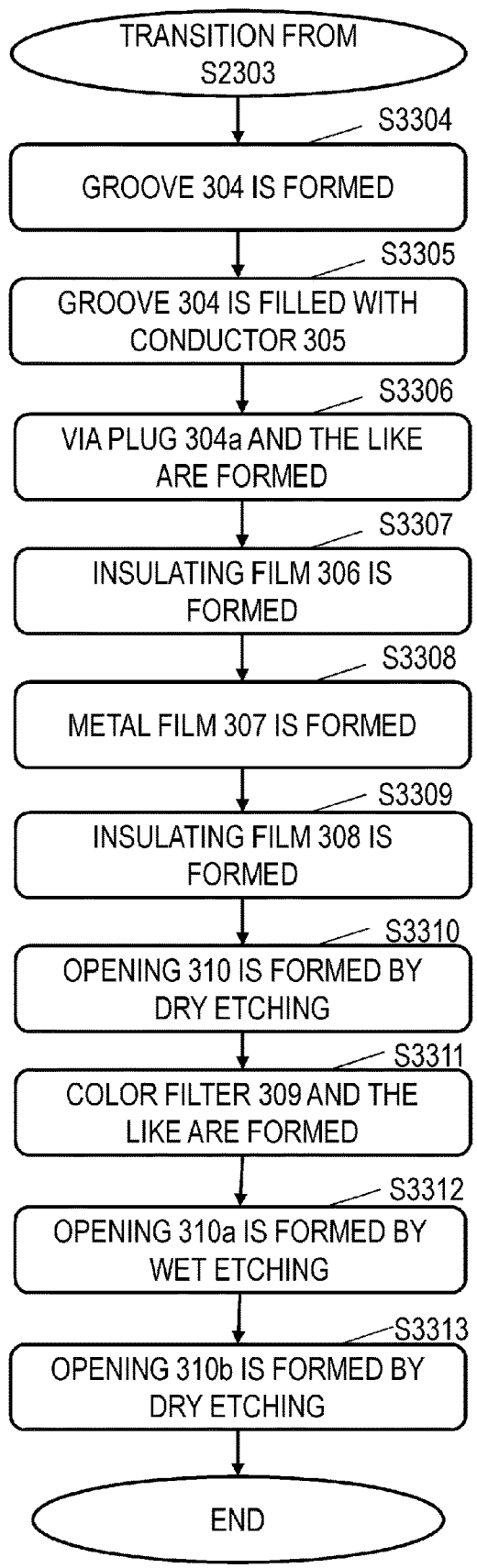
FIG. 26A is a flowchart showing a method for producing a semiconductor device according to Modification Example 5.

As Modification Example 5, a method for producing the semiconductor device APR more easily than in Embodiment 2 will be described with reference to the flowchart shown in FIG. 26A. The processing of S2301 to S2303 is performed in the same manner as in Embodiment 2, and thus the description thereof is omitted. Described hereinbelow is the processing of S3304, to which a transition is made from S2303, and that of subsequent steps.

Figure 27:
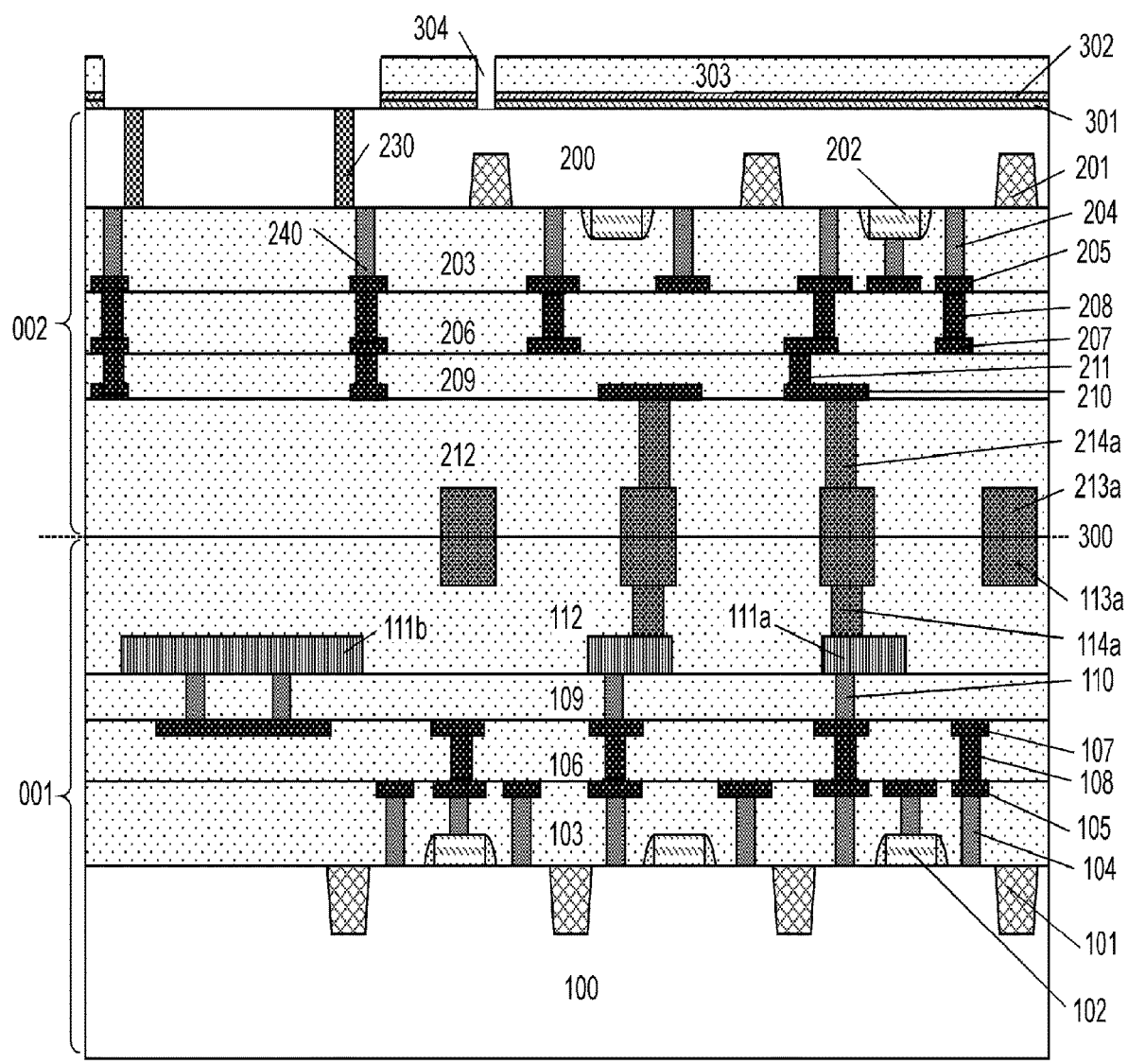
FIG. 27 is a cross-sectional view showing the production steps of the semiconductor device according to Modification Example 5.

In S3304, as shown in FIG. 27, the groove 304 for embedding a metal structure is formed in the metal oxide film 301, the antireflective film 302 and the insulating film 303. At this time, by contrast with the configuration of Embodiment 2 shown in FIG. 21, a similar groove is also formed in the region for forming an opening.

Figure 28:
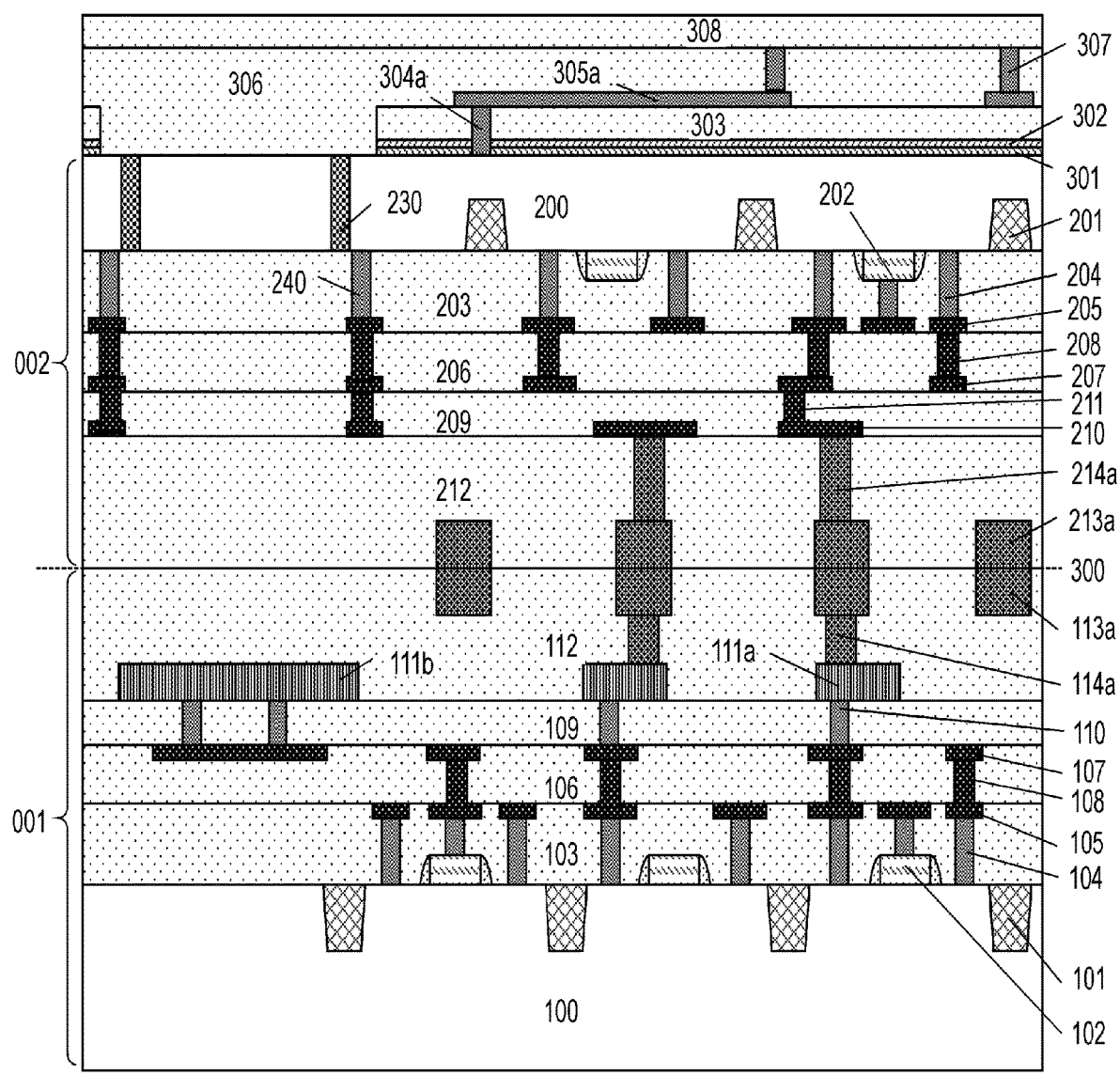
FIG. 28 is a cross-sectional view showing the production steps of the semiconductor device according to Modification Example 5.

The structure formed in S3305 and subsequent steps is shown in FIG. 28. In S3305, the conductor 305 is formed over the entire surface of the semiconductor layer 200 and the antireflective film 302 in the same manner as in S2305. At this time, the groove 304 is filled with the conductor 305. The material of the conductor 305 may be tungsten or the like.

In S3306, the conductor 305 is patterned in the same manner as in S2306. The patterning can be performed by photolithography and etching. A part of the conductor 305 is formed by patterning as the metal film 305a. At the same time, the via plug 304a connecting the metal film 305a and the semiconductor layer 200 is formed, and the conductor 305 formed in the region for forming the opening is removed.

In S3307, the insulating film 306 is formed on the semiconductor layer 200 and the insulating film 303 in the same manner as in S2307.

In S3308, a groove is formed in the insulating film 306 by etching, and then a conductor is formed over the entire surface of the insulating film 306 by PVD or CVD, and the groove is filled with the conductor in the same manner as in S2308. Then, the conductor on the surface of the insulating film 306 is removed by chemical mechanical polishing, etch back, or the like, whereby the metal film 307 is formed inside the insulating film 306.

In S3309, as shown in FIG. 28, the insulating film 308 is formed on the insulating film 306.

Figure 29:
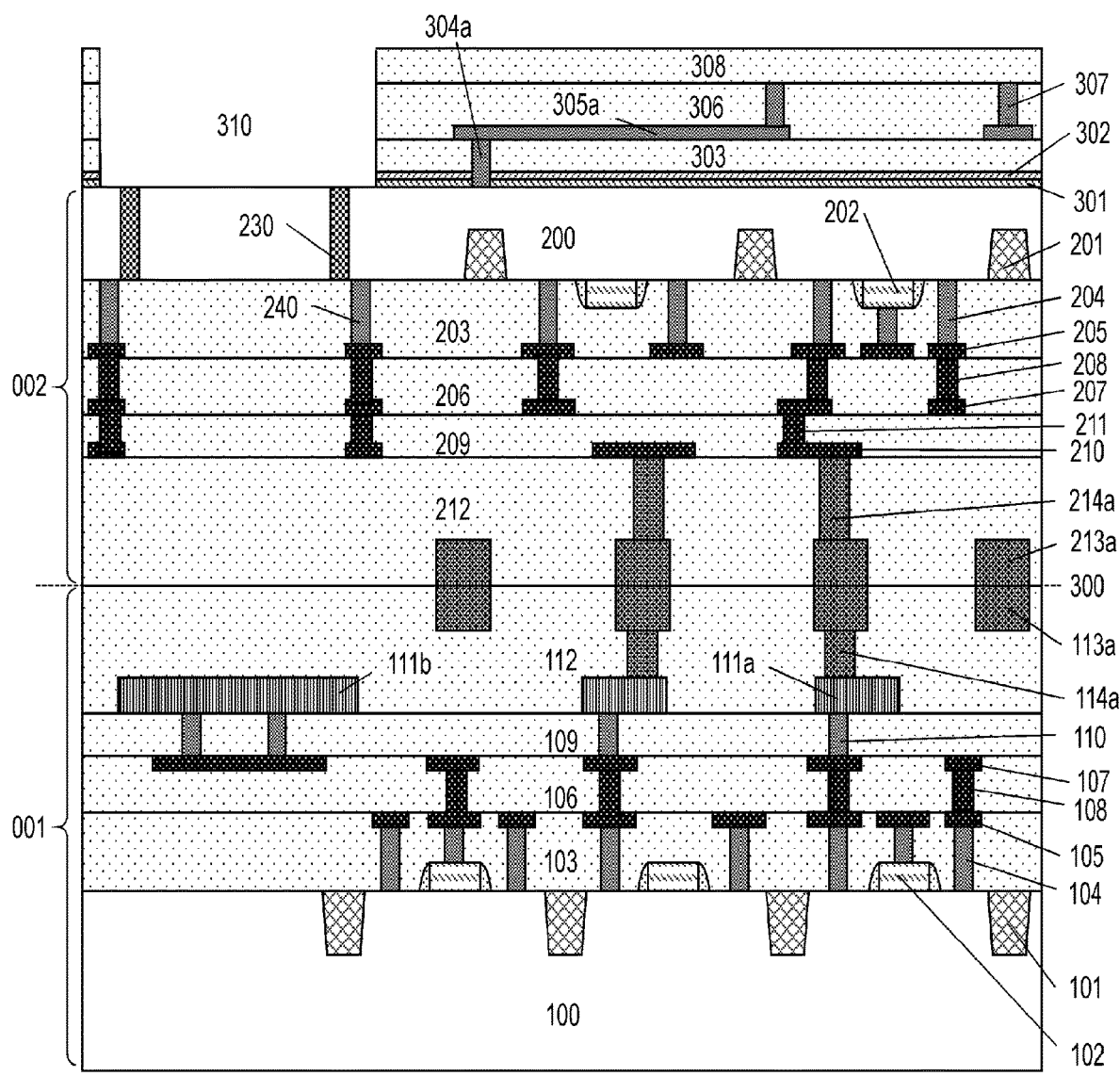
FIG. 29 is a cross-sectional view showing the production steps of the semiconductor device according to Modification Example 5.

In S3310, as shown in FIG. 29, the insulating film 306 and the insulating film 308 formed in the region for forming the opening are removed by dry etching, whereby the opening 310 is formed.

In S3311, the color filter 309 and a microlens (not shown) are formed on the insulating film 308.

Figure 30:
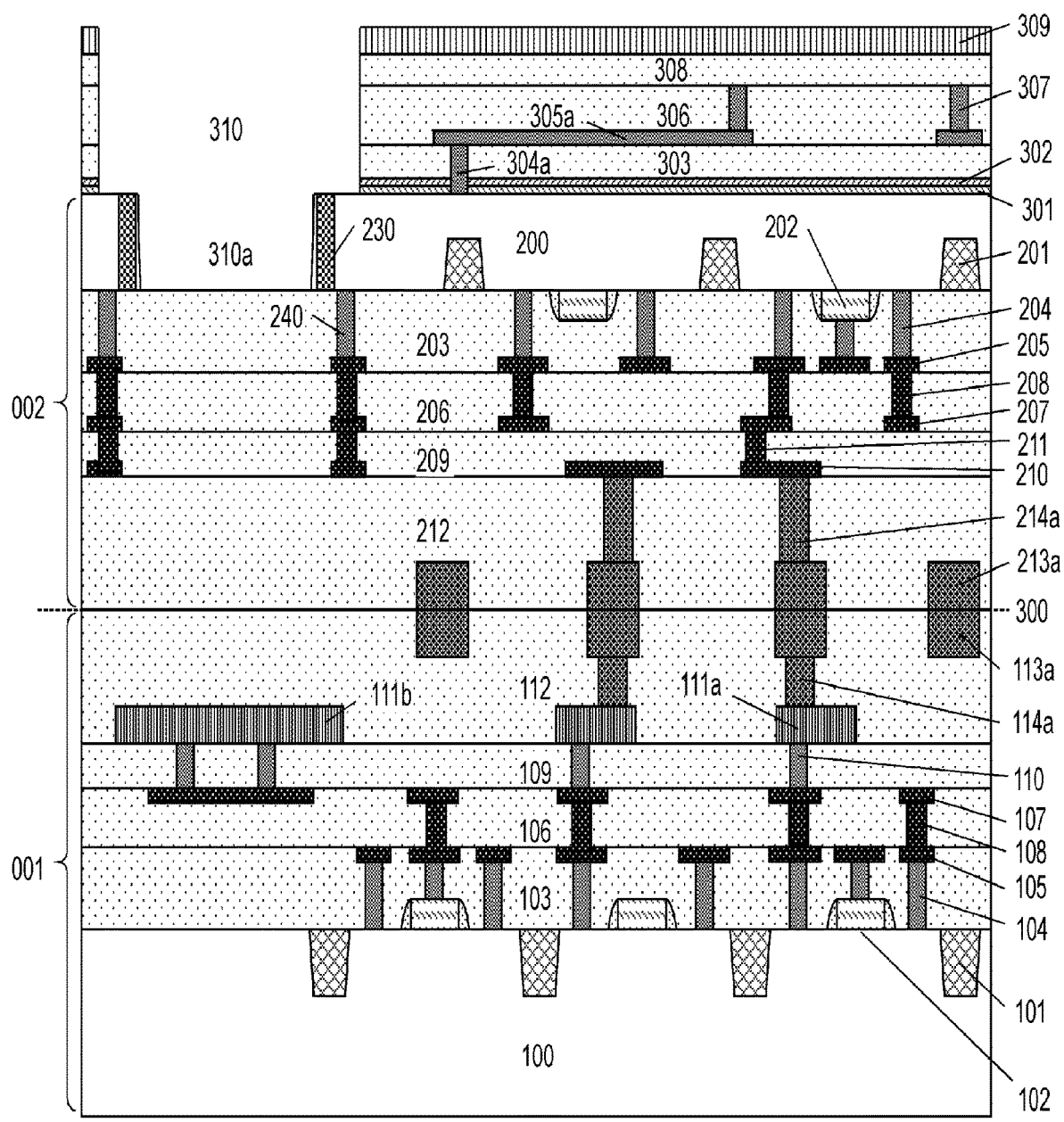
FIG. 30 is a cross-sectional view showing the production steps of the semiconductor device according to Modification Example 5.

In S3312, as shown in FIG. 30, the opening 310a is formed by performing wet etching of the semiconductor layer 200 in order to expose a part of the external connection electrode 111b from the surface of the uppermost layer of the stacked layers. At this time, only the inner side surrounded by the isolation region 230 is formed into the opening 310a by performing etching so that the etching rates of the semiconductor layer 200 and the isolation region 230 are different.

Figure 31:
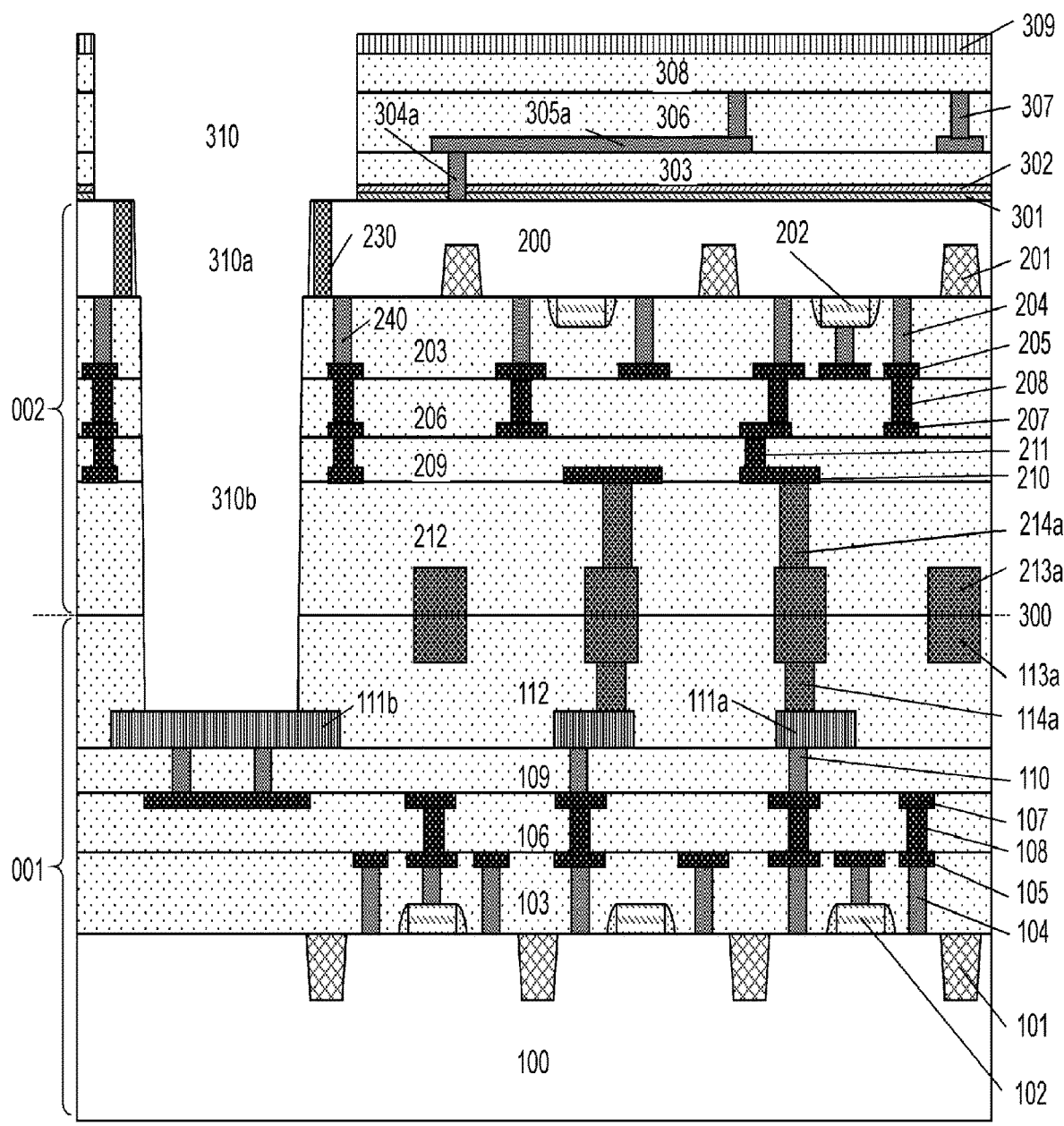
FIG. 31 is a cross-sectional view showing the production steps of the semiconductor device according to Modification Example 5.

In S3313, as shown in FIG. 31, the opening 310b for exposing a part of the external connection electrode 111b is formed by dry etching in the same manner as in S2312.

Effects

In this Modification Example, since the metal oxide film 301 and the like in the portion to be made an opening in a later step are removed in advance, etching is easier to perform when forming the opening in the layer formed above the semiconductor layer 200 as compared with Embodiment 2.

Modification Example 6

As Modification Example 6, a method for producing the semiconductor device APR that is capable of suppressing a decrease in the reliability of the semiconductor device as compared with Embodiment 2 will be described with reference to the flowchart shown in FIG. 32A. The processing of S2301 to S2309 is performed in the same manner as in Embodiment 2, and thus the description thereof is omitted. Described hereinbelow is the processing of S4310, to which a transition is made from S2309, and that of subsequent steps. Here, at the time of transition to S4310, the semiconductor device APR as shown in FIG. 22 has been formed.

Figure 33:
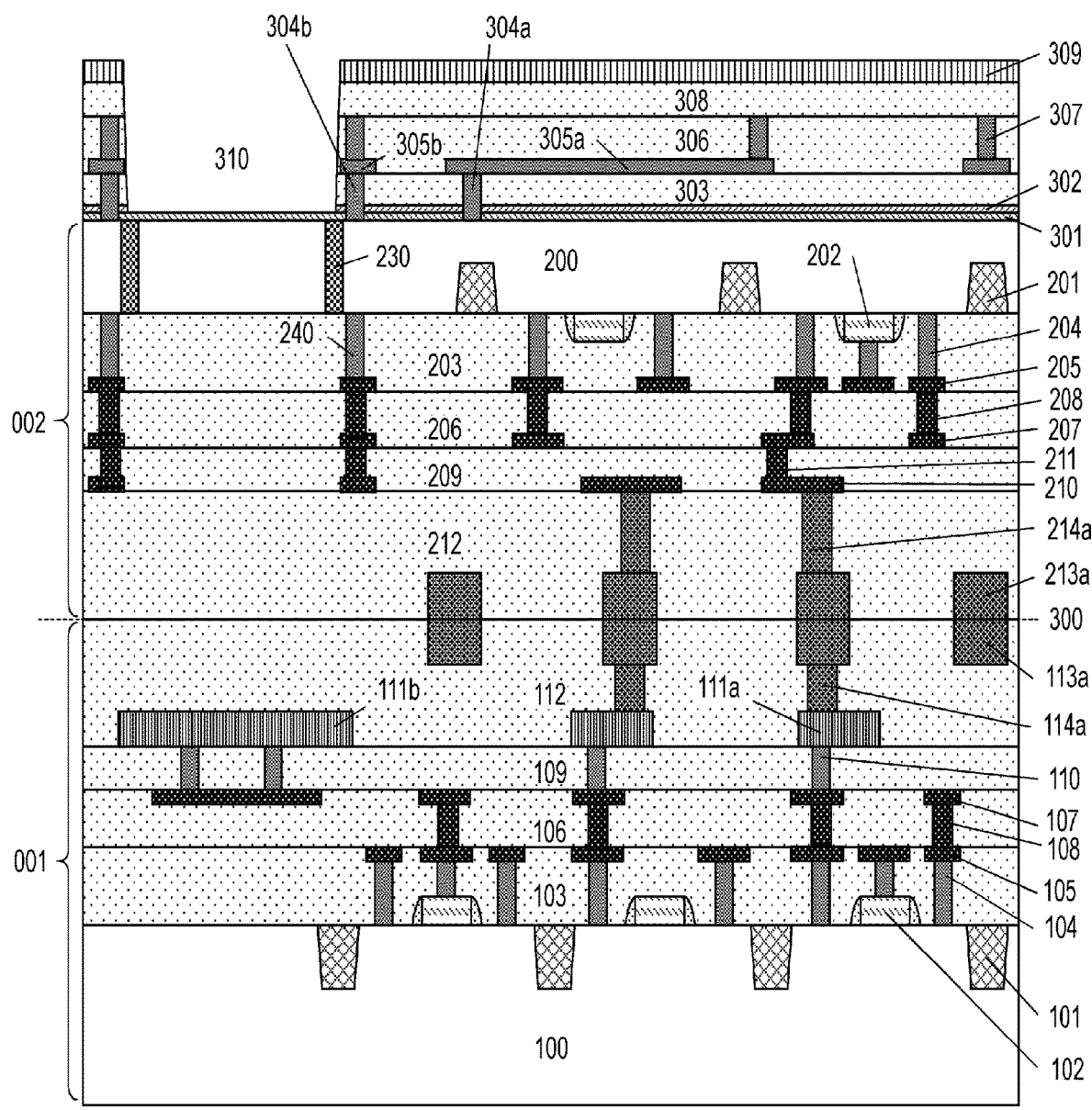
FIG. 33 is a cross-sectional view showing the production steps of the semiconductor device according to Modification Example 6.

In S4310, as shown in FIG. 33, the opening 310 is formed by dry etching to expose a part of the external connection electrode 111b from the surface of the uppermost layer of the stacked layers. At this time, the etching is stopped at the interface between the metal oxide film 301 and the antireflective film 302 by performing etching so that the etching rates of the metal oxide film 301 and the antireflective film 302 are different.

In S4311, the opening 310a is formed by performing wet etching of the metal oxide film 301 and the semiconductor layer 200 in the same manner as in S2311 described with reference to FIG. 24. At this time, only the inner side surrounded by the isolation region 230 is formed into the opening 310a by performing etching so that the etching rates of the semiconductor layer 200 and the isolation region 230 are different.

In S4312, the opening 310b for exposing a part of the external connection electrode 111b is formed by dry etching in the same manner as in S2312 described with reference to FIG. 25.

Effects

Since wet etching of the semiconductor layer 200 is performed after the dry etching for forming the opening 310 in the layer formed above the semiconductor layer 200 has been stopped by the metal oxide film 301 on the semiconductor layer 200. Thus, plasma damage to the semiconductor layer 200 caused by dry etching can be suppressed as compared to Embodiment 2. Therefore, the decrease in the reliability of the semiconductor device can be suppressed more than in Embodiment 2.

Modification Example 7

As Modification Example 7, a method for producing a semiconductor device APR that is capable of suppressing a decrease in the reliability of the semiconductor device as compared with Embodiment 2 will be described with reference to the flowchart shown in FIG. 32B. The processing of S2301 to S2309 is performed in the same manner as in Embodiment 2, and thus the description thereof is omitted. Described hereinbelow is the processing of S5310, to which a transition is made from S2309, and that of subsequent steps.

In S5310, the opening 310 is formed by dry etching in order to expose a part of the external connection electrode 111b from the surface of the uppermost layer of the stacked layers, in the same manner as in S4310 described with reference to FIG. 31A. At this time, unlike S4310, the etching is stopped at the interface between the antireflective film 302 and the insulating film 303 by performing etching so that the etching rates of the antireflective film 302 and the insulating film 303 are different.

In S5311, the opening 310a is formed by wet-etching the metal oxide film 301, the antireflective film 302, and the semiconductor layer 200 in the same manner as S2311 described with reference to FIG. 24. At this time, only the inner side surrounded by the isolation region 230 is formed into the opening 310a by performing etching so that the etching rates of the semiconductor layer 200 and the isolation region 230 are different.

In S5312, the opening 310b for exposing a part of the external connection electrode 111b is formed by dry etching in the same manner as in S2312 described with reference to FIG. 25.

Effects

Since wet etching of the semiconductor layer 200 is thus performed after the dry etching has been stopped by the antireflective film 302 on the semiconductor layer 200, plasma damage to the semiconductor layer 200 caused by dry etching can be suppressed as compared to Embodiment 2. Therefore, the decrease in the reliability of the semiconductor device can be suppressed more than in Embodiment 2.

Modification Example 8

Figure 26B:
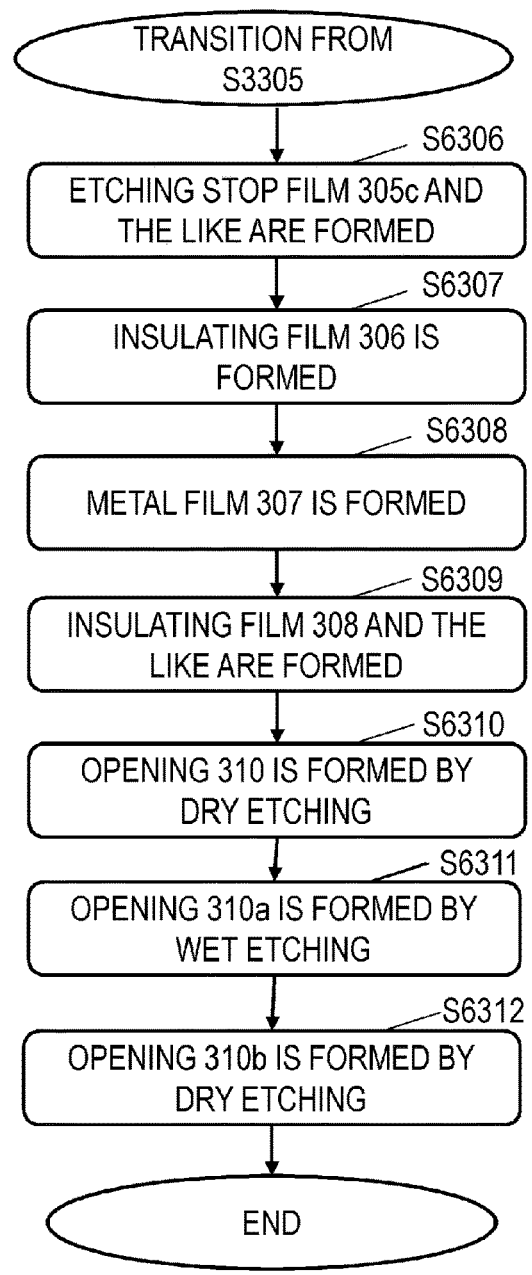
FIG. 26B is a flowchart showing a method for producing a semiconductor device according to Modification Example 8.

As Modification Example 8, a method for producing the semiconductor device APR that is capable of suppressing a decrease in the reliability of the semiconductor device as compared with Embodiment 2 will be described with reference to the flowchart shown in FIG. 26B. The processing of S2301 to S2303 and S3304 to S3305 is performed in the same manner as in Modification Example 5, and thus the description thereof is omitted. Described hereinbelow is the processing of S6306, to which a transition is made from S3305, and that of subsequent steps. Here, at the time of transition to S6306, the conductor 305 has been formed over the entire surface of the semiconductor layer 200 or the antireflective film 302 of the semiconductor device APR shown in FIG. 27.

Figure 34:
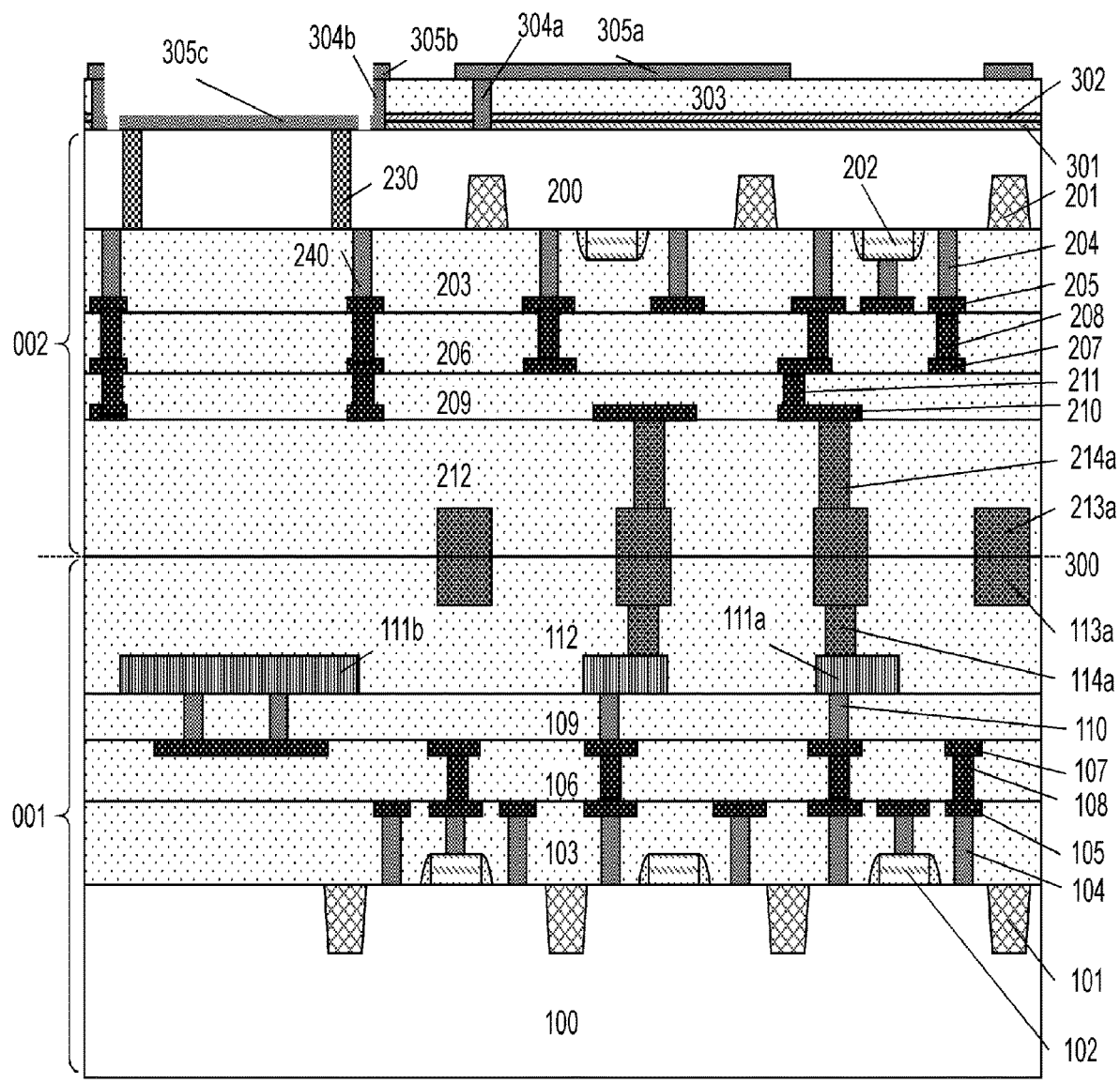
FIG. 34 is a cross-sectional view showing the production steps of the semiconductor device according to Modification Example 8.

In S6306, as shown in FIG. 34, the conductor 305 is patterned. The patterning is performed by photolithography and etching. By the patterning, a part of the conductor 305 is formed as the metal film 305a, a part is formed as the guard ring 305b, and a part is formed as an etching stop film 305c. Here, the etching stop film 305c is formed to be connected to the semiconductor layer 200. In S6306, the via plug 304a and the guard ring 304b that connect the metal film 305a and the semiconductor layer 200 are formed. The guard ring 304b is disposed to surround the outer periphery of the isolation region 230.

In S6307, the insulating film 306 is formed on the semiconductor layer 200 and the insulating film 303 in the same manner as in S2307.

In S6308, a groove is formed by etching the surface of the insulating film 306, a conductor is formed over the entire surface of the insulating film 306 by PVD or CVD, and the groove is filled with the conductor. Then, the conductor on the surface of the insulating film 306 is removed by chemical mechanical polishing, etch back, or the like, whereby metal film 307 is formed inside the insulating film 306 in the same manner as in S2308.

Figure 35:
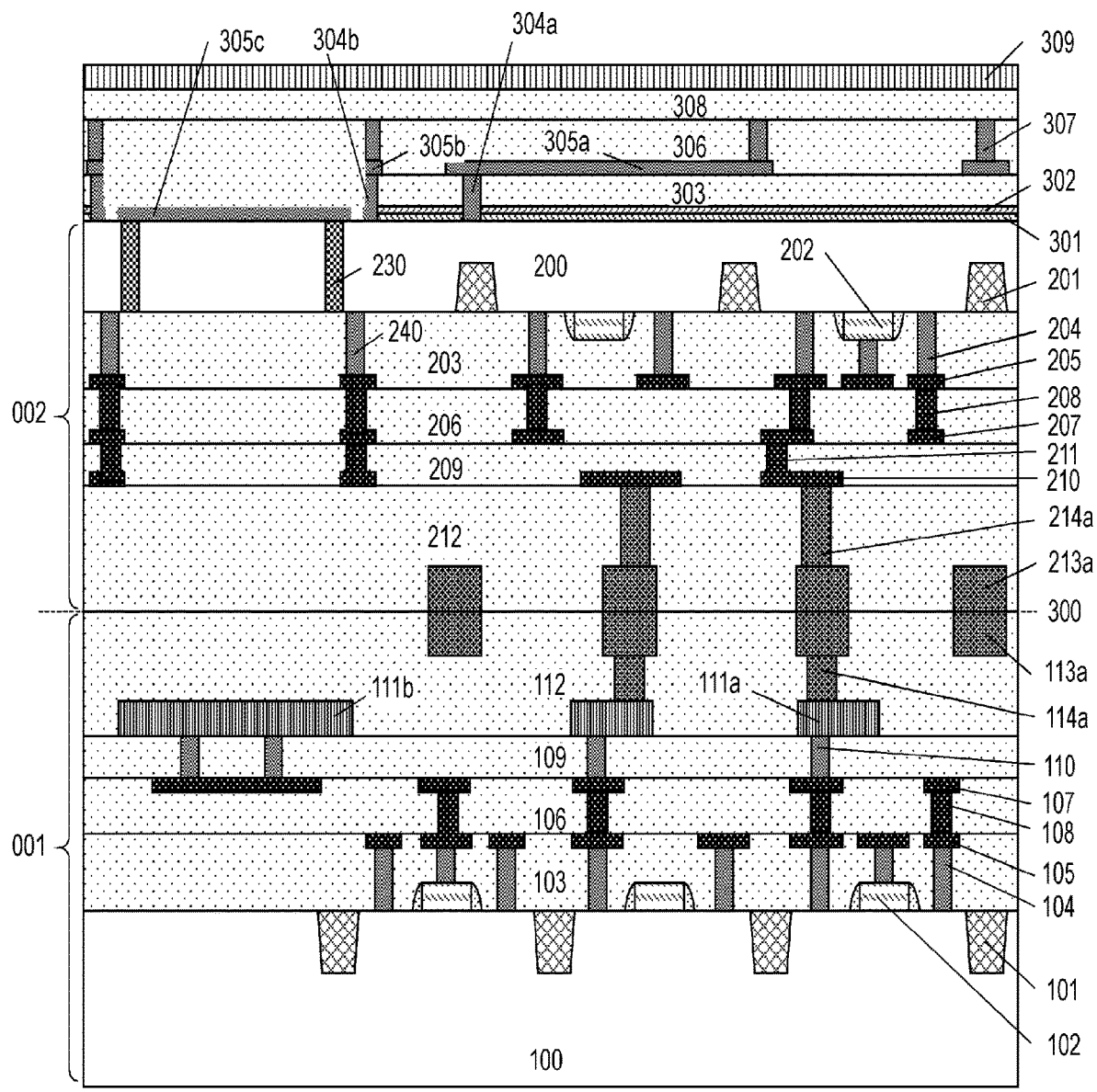
FIG. 35 is a cross-sectional view showing the production steps of the semiconductor device according to Modification Example 8.

In S6309, as shown in FIG. 35, the insulating film 308, the color filter 309, and a micro lens (not shown) are formed on the insulating film 306 in the same manner as in S2309 described with reference to FIG. 22.

Figure 36:
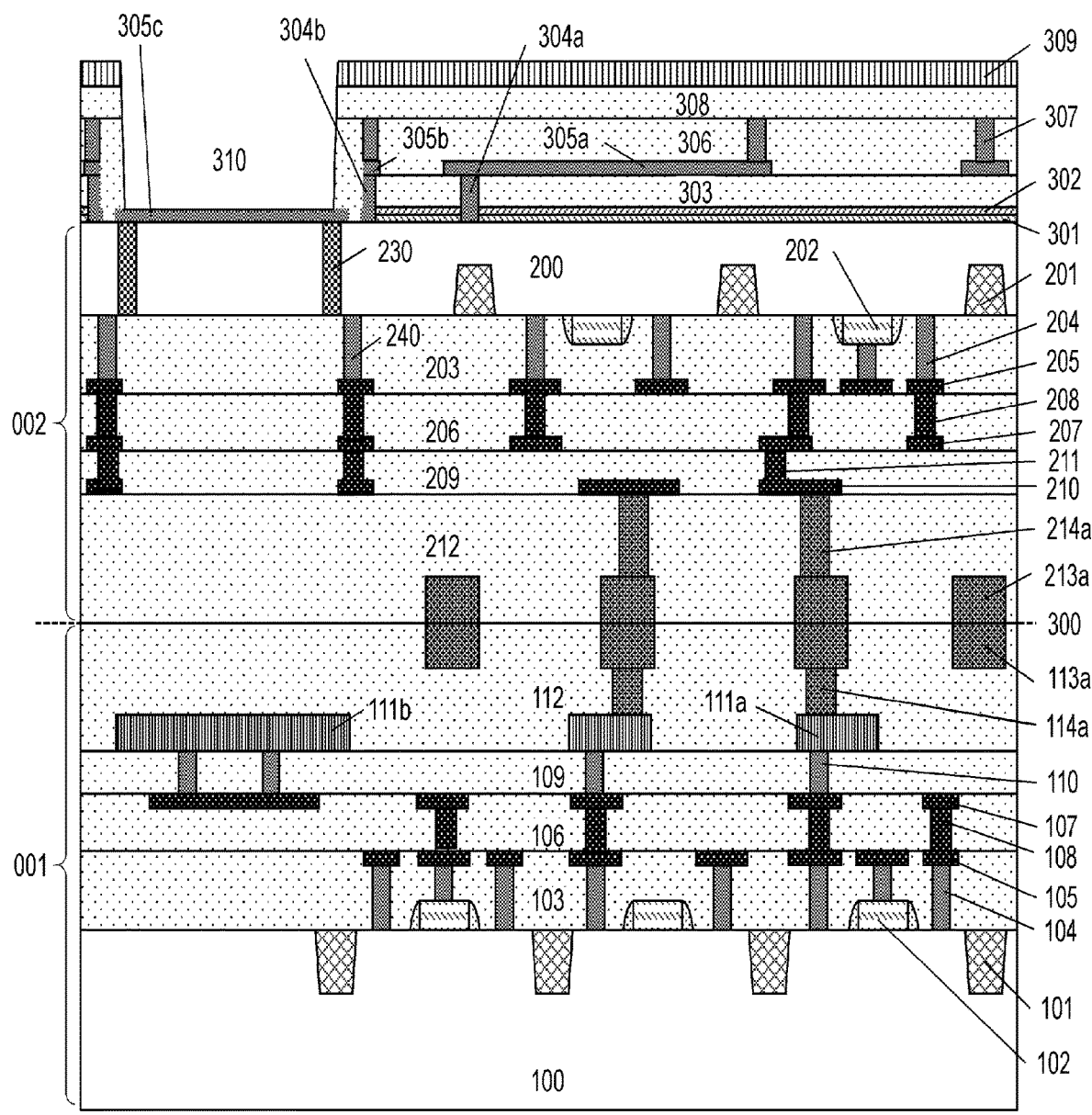
FIG. 36 is a cross-sectional view showing the production steps of the semiconductor device according to Modification Example 8.

In S6310, as shown in FIG. 36, the opening 310 is formed by dry etching in order to expose a part of the external connection electrode 111b from the uppermost layer surface of the stacked layers in the same manner as in S2310 described with reference to FIG. 23. At this time, the etching is stopped at the interface between the etching stop film 305c and the semiconductor layer 200 by performing etching so that the etching rates of the etching stop film 305c and the semiconductor layer 200 are different.

In S6311, the opening 310a is formed by wet-etching the etching stop film 305c and the semiconductor layer 200 in the same manner as in S2311 described with reference to FIG. 24. At this time, only the inner side surrounded by the isolation region 230 is formed into the opening 310a by performing etching so that the etching rates of the semiconductor layer 200 and the isolation region 230 are different.

In S6312, the opening 310b for exposing a part of the external connection electrode 111b is formed by dry etching in the same manner as in S2312 described with reference to FIG. 25.

Since wet etching of the semiconductor layer 200 is thus performed after the dry etching has been stopped by the etching stop film 305c, plasma damage to the semiconductor layer 200 caused by dry etching can be suppressed as compared to Embodiment 2. Therefore, the decrease in the reliability of the semiconductor device can be suppressed more than in Embodiment 2.

The Embodiments and Modification Examples described above can be changed, as appropriate, without departing from the technical concept. The contents disclosed in the Embodiments and Modification Examples include not only what is specified in the present description, but also all matters that can be grasped from the present description and the drawings attached to the present description.

With the technique of the present disclosure, the reliability of the semiconductor device is improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-197131, filed on Oct. 19, 2018, which is hereby incorporated by reference herein in its entirety.

What is claimed is:

1. A semiconductor device comprising:
a substrate;
a semiconductor layer; and
a wiring structure section between the substrate and the semiconductor layer, the wiring structure section including a plurality of stacked wiring layers and a plurality of stacked insulating films, the wiring structure section including an electrode,
wherein an opening for connecting a member to the electrode is formed in the semiconductor layer and the wiring structure section,
wherein the semiconductor layer has an isolation region in which an insulating film is embedded and which surrounds the opening,
wherein the wiring structure section has a ring which is formed of the plurality of wiring layers and surround the opening, and
wherein a distance between the opening and the ring closest to the opening is larger than a distance between the opening and the isolation region closest to the opening.

2. The semiconductor device according to claim 1, wherein the ring is electrically connected to a portion of the semiconductor layer on an opposite side of the isolation region from the opening.

3. The semiconductor device according to claim 1, wherein the substrate is a semiconductor substrate provided with a transistor,
wherein the wiring structure section has (1) a first wiring structure located between the semiconductor substrate and the semiconductor layer, and (2) a second wiring structure located between the semiconductor layer and the first wiring structure, and
wherein in the wiring structure section, the first wiring structure and the second wiring structure are bonded together.

4. The semiconductor device according to claim 3, wherein the electrode is provided in the first wiring structure.

5. The semiconductor device according to claim 3, wherein each of the first wiring structure and the second wiring structure has a conductor portion, and
wherein the conductor portion of the first wiring structure and the conductor portion of the second wiring structure are bonded to each other.

6. The semiconductor device according to claim 5, wherein each of the first wiring structure and the second wiring structure has one or more of the conductor portions at a distance from the opening that is shorter than the distance between the opening and the ring closest to the opening.

7. The semiconductor device according to claim 5, wherein the ring is formed to be connected to the conductor portion.

8. The semiconductor device according to claim 7, further comprising a second ring formed between the ring and the opening and connected to the electrode,
wherein the second ring includes a conductor portion different from the conductor portion to which the ring is connected.

9. The semiconductor device according to claim 1, wherein a spacing of the ring across the opening is greater than a spacing of the isolation regions across the opening.

10. The semiconductor device according to claim 1, wherein an insulating film which is a silicon compound film including nitrogen is provided between the ring and the electrode.

11. The semiconductor device according to claim 1, wherein the electrode includes aluminum as a main component, and
wherein the ring includes a portion including copper as a main component.

12. The semiconductor device according to claim 1, wherein an insulating film is provided on an opposite side of the semiconductor layer from the substrate,
wherein the opening is also provided in the insulating film,
wherein metal rings are provided to surround the opening of the insulating film, and
wherein a distance between the opening and the ring closest to the opening is larger than a distance between the opening and the metal ring closest to the opening.

13. The semiconductor device according to claim 12, wherein a spacing of the isolation regions across the opening is smaller than a spacing of the metal rings across the opening.

14. The semiconductor device according to claim 1, wherein the semiconductor layer is provided with a photodiode.

15. An apparatus comprising:
the semiconductor device according to claim 1; and
at least one of the following six items:
(1) an optical system configured to form an image on the semiconductor device;
(2) a control device configured to control the semiconductor device;
(3) a processing device configured to process a signal outputted from the semiconductor device;
(4) a display device configured to display information obtained by the semiconductor device;
(5) a storage device configured to store information obtained by the semiconductor device; and
(6) a mechanical device configured to have a movable unit or a propellant unit.

16. A method for producing a semiconductor device, the method comprising:
a step of preparing a member including a substrate, a semiconductor layer having an isolation region in which an insulating film is embedded, and a wiring structure section including a plurality of stacked wiring layers and a plurality of stacked insulating films, the wiring structure section being provided between the substrate and the semiconductor layer; and
a step of forming an opening for exposing a part of an electrode included in the wiring structure section to the outside in the semiconductor layer and the wiring structure section,
wherein the wiring structure section has a ring formed by the plurality of wiring layers, and
wherein in the step of forming the opening, the opening is formed such that a distance between the opening and the ring closest to the opening is larger than a distance between the opening and the isolation region closest to the opening.

17. The method for producing a semiconductor device according to claim 16, wherein in the step of forming the opening, the opening is formed by dry etching the semiconductor layer.

18. The method for producing a semiconductor device according to claim 16, wherein in the step of forming the opening, the opening is formed by wet etching the semiconductor layer.

* * * * *